United States Patent
Petrovski et al.

(10) Patent No.: US 10,208,990 B2
(45) Date of Patent: Feb. 19, 2019

(54) THERMOELECTRIC DEVICE CONTROLS AND METHODS

(71) Applicant: GENTHERM INCORPORATED, Northville, MI (US)

(72) Inventors: Dusko Petrovski, Rochester, MI (US); Sihai Zheng, Canton, MI (US); Michael Maass, Ypsilanti, MI (US)

(73) Assignee: GENTHERM INCORPORATED, Northville, MI (US)

( * ) Notice: Subject to any disclaimer, the term of this patent is extended or adjusted under 35 U.S.C. 154(b) by 0 days.

(21) Appl. No.: 15/627,098

(22) Filed: Jun. 19, 2017

(65) Prior Publication Data

US 2017/0284710 A1 Oct. 5, 2017

Related U.S. Application Data

(63) Continuation of application No. 13/646,581, filed on Oct. 5, 2012, now Pat. No. 9,685,599.

(Continued)

(51) Int. Cl.
*F25B 21/04* (2006.01)
*H01L 35/00* (2006.01)
(Continued)

(52) U.S. Cl.
CPC .............. *F25B 21/04* (2013.01); *F25B 21/02* (2013.01); *H01L 35/00* (2013.01); *H01L 35/30* (2013.01);
(Continued)

(58) Field of Classification Search
CPC ........... F25B 21/00; F25B 21/02; F25B 21/04
See application file for complete search history.

(56) References Cited

U.S. PATENT DOCUMENTS 1,839,156 A 12/1931 Lumpkin
2,235,620 A 3/1941 Nessell
(Continued)

FOREIGN PATENT DOCUMENTS

CA 979490 12/1975
CN 2128076 3/1993
(Continued)

OTHER PUBLICATIONS

NPL1—Luo, Z., "A Simple Method to Estimate the Physical Characteristics of a Thermoelectric Cooler from Vendor Datasheets," Electronics Cooling, Aug. 2008.*

(Continued)

*Primary Examiner* — Jianying Atkisson
*Assistant Examiner* — Antonio R Febles
(74) *Attorney, Agent, or Firm* — Knobbe, Martens, Olson & Bear, LLP

(57) ABSTRACT

According to some embodiments, a thermoelectric system includes a thermoelectric device having a first surface and a second surface and a power source configured to deliver a voltage across the thermoelectric device to selectively activate or deactivate the thermoelectric device, wherein the first surface is configured to heat and the second surface is configured to cool when the thermoelectric device is activated. The system further includes a processor configured to determine a potential between the first surface and the second surface when the thermoelectric device is deactivated, correlate the potential to a temperature of the first surface and adjust the correlated temperature of the first surface based on an ambient temperature.

23 Claims, 10 Drawing Sheets

Related U.S. Application Data

(60) Provisional application No. 61/545,017, filed on Oct. 7, 2011.

(51) Int. Cl.
  *H01L 35/34*  (2006.01)
  *F25B 21/02*  (2006.01)
  *H01L 35/30*  (2006.01)
  *H02J 3/38*  (2006.01)
  *H02J 3/46*  (2006.01)
  *H02J 7/34*  (2006.01)

(52) U.S. Cl.
  CPC .............. *H01L 35/34* (2013.01); *H02J 3/381* (2013.01); *H02J 3/46* (2013.01); *H02J 7/34* (2013.01); *F25B 2321/0212* (2013.01)

(56) References Cited

U.S. PATENT DOCUMENTS

| | | |
|---|---|---|
| 2,362,259 A | 11/1944 | Findley |
| 2,363,168 A | 11/1944 | Findley |
| 2,461,432 A | 2/1949 | Mitchell |
| 2,462,984 A | 3/1949 | Maddison |
| 2,493,067 A | 1/1950 | Goldsmith |
| 2,512,559 A | 6/1950 | Williams |
| 2,519,241 A | 8/1950 | Findley |
| 2,782,834 A | 2/1957 | Vigo |
| 2,791,956 A | 5/1957 | Guest |
| 2,813,708 A | 11/1957 | Frey |
| 2,884,956 A | 5/1959 | Perlin |
| 2,931,286 A | 4/1960 | Fry, Sr. et al. |
| 2,959,017 A | 11/1960 | Gilman et al. |
| 2,976,700 A | 3/1961 | Jackson |
| 2,984,077 A | 5/1961 | Gaskill |
| 3,019,509 A | 2/1962 | Pietsch |
| 3,030,145 A | 4/1962 | Kottemann |
| 3,039,817 A | 6/1962 | Taylor |
| 3,077,079 A | 2/1963 | Pietsch |
| 3,085,405 A | 4/1963 | Frantti |
| 3,090,206 A | 5/1963 | Anders |
| 3,136,577 A | 6/1964 | Richard |
| 3,137,142 A | 6/1964 | Venema |
| 3,137,523 A | 6/1964 | Karner |
| 3,138,934 A | 6/1964 | Roane |
| 3,178,934 A | 4/1965 | Mole et al. |
| 3,186,240 A | 6/1965 | Daubert |
| 3,197,342 A | 7/1965 | Neild |
| 3,212,275 A | 10/1965 | Tillman |
| 3,240,628 A | 3/1966 | Sonntag, Jr. |
| 3,253,649 A | 5/1966 | Laing |
| 3,266,064 A | 8/1966 | Figman |
| 3,282,267 A | 11/1966 | Eidus |
| 3,298,195 A | 1/1967 | Raskhodoff |
| 3,300,649 A | 1/1967 | Strawn |
| 3,325,312 A | 6/1967 | Sonntag, Jr. |
| 3,326,727 A | 6/1967 | Fritts |
| 3,351,498 A | 11/1967 | Shinn et al. |
| 3,366,164 A | 1/1968 | Newton |
| 3,392,535 A | 7/1968 | De Castelet |
| 3,486,177 A | 12/1969 | Marshack |
| 3,529,310 A | 9/1970 | Olmo |
| 3,550,523 A | 12/1970 | Segal |
| 3,599,437 A | 8/1971 | Panas |
| 3,615,870 A | 10/1971 | Crouthamel |
| 3,627,299 A | 12/1971 | Schwaitze et al. |
| 3,632,451 A | 1/1972 | Abbott |
| 3,640,456 A | 2/1972 | Sturgis |
| 3,648,469 A | 3/1972 | Chapman |
| 3,703,141 A | 11/1972 | Pernoud |
| 3,767,470 A | 10/1973 | Hines |
| 3,786,230 A | 1/1974 | Brandenburg, Jr. |
| 3,819,418 A | 6/1974 | Winkler et al. |
| 3,839,876 A | 10/1974 | Privas |
| 3,870,568 A | 3/1975 | Oesterheit et al. |
| 3,876,860 A | 4/1975 | Nomura et al. |
| 3,894,213 A | 7/1975 | Agarwala |
| 3,899,054 A | 8/1975 | Huntress et al. |
| 3,902,923 A | 9/1975 | Evans et al. |
| 3,916,151 A | 10/1975 | Reix |
| 3,926,052 A | 12/1975 | Bechtel |
| 3,927,299 A | 12/1975 | Sturgis |
| 3,928,876 A | 12/1975 | Starr |
| 4,002,108 A | 1/1977 | Drori |
| 4,044,824 A | 8/1977 | Eskeli |
| 4,124,794 A | 11/1978 | Eder |
| 4,195,687 A | 4/1980 | Taziker |
| 4,223,205 A | 9/1980 | Sturgis |
| 4,224,565 A | 9/1980 | Sosniak et al. |
| 4,281,516 A | 8/1981 | Berthet et al. |
| 4,315,599 A | 2/1982 | Biancardi |
| 4,336,444 A | 6/1982 | Bice et al. |
| 4,338,944 A | 7/1982 | Arkans |
| 4,391,009 A | 7/1983 | Schild et al. |
| 4,413,857 A | 11/1983 | Hayashi |
| 4,423,308 A | 12/1983 | Callaway et al. |
| 4,437,702 A | 3/1984 | Agosta |
| 4,438,070 A | 3/1984 | Stephens et al. |
| 4,459,428 A | 7/1984 | Chou |
| 4,491,173 A | 1/1985 | Demand |
| 4,493,939 A | 1/1985 | Blaske et al. |
| 4,497,973 A | 2/1985 | Heath et al. |
| 4,506,510 A | 3/1985 | Tircot |
| 4,518,700 A | 5/1985 | Stephens |
| 4,518,847 A | 5/1985 | Horst, Sr. et al. |
| 4,549,134 A | 10/1985 | Weiss |
| 4,554,968 A | 11/1985 | Haas |
| 4,567,351 A | 1/1986 | Kitagawa et al. |
| 4,572,430 A | 2/1986 | Takagi et al. |
| 4,639,883 A | 1/1987 | Michaelis |
| 4,665,707 A | 5/1987 | Hamilton |
| 4,671,567 A | 6/1987 | Frobose |
| 4,677,416 A | 6/1987 | Nishimoto et al. |
| 4,685,727 A | 8/1987 | Cremer et al. |
| 4,688,390 A | 8/1987 | Sawyer |
| 4,704,320 A | 11/1987 | Mizunoya et al. |
| 4,711,294 A | 12/1987 | Jacobs et al. |
| 4,712,832 A | 12/1987 | Antolini et al. |
| 4,777,802 A | 10/1988 | Feher |
| 4,782,664 A | 11/1988 | Sterna et al. |
| 4,791,274 A | 12/1988 | Horst |
| 4,793,651 A | 12/1988 | Inagaki et al. |
| 4,802,929 A | 2/1989 | Schock |
| 4,812,733 A | 3/1989 | Tobey |
| 4,823,554 A | 4/1989 | Trachtenberg et al. |
| 4,825,488 A | 5/1989 | Bedford |
| 4,828,627 A | 5/1989 | Connery |
| 4,853,992 A | 8/1989 | Yu |
| 4,923,248 A | 5/1990 | Feher |
| 4,947,648 A | 8/1990 | Harwell et al. |
| 4,959,684 A | 11/1990 | Zarotti |
| 4,981,324 A | 1/1991 | Law |
| 4,988,847 A | 1/1991 | Argos et al. |
| 4,997,230 A | 3/1991 | Spitalnick |
| 5,002,336 A | 3/1991 | Feher |
| 5,012,325 A | 4/1991 | Mansuria et al. |
| 5,014,909 A | 5/1991 | Yasuo |
| 5,016,304 A | 5/1991 | Ryhiner |
| 5,022,462 A | 6/1991 | Flint et al. |
| 5,057,490 A | 10/1991 | Skertic |
| 5,070,937 A | 12/1991 | Mougin et al. |
| 5,077,709 A | 12/1991 | Feher |
| 5,088,790 A | 2/1992 | Wainwright et al. |
| 5,097,674 A | 3/1992 | Imaiida et al. |
| 5,102,189 A | 4/1992 | Saito et al. |
| 5,106,161 A | 4/1992 | Meiller |
| 5,111,025 A | 5/1992 | Barma et al. |
| 5,111,664 A | 5/1992 | Yang |
| 5,117,638 A | 6/1992 | Feher |
| 5,119,640 A | 6/1992 | Conrad |
| 5,125,238 A | 6/1992 | Ragan et al. |
| 5,148,977 A | 9/1992 | Hibino et al. |
| 5,166,777 A | 11/1992 | Kataoka |
| 5,187,349 A | 2/1993 | Curhan et al. |

(56) References Cited

U.S. PATENT DOCUMENTS

| | | |
|---|---|---|
| 5,188,286 A | 2/1993 | Pence, IV |
| 5,255,735 A | 10/1993 | Raghava et al. |
| 5,256,857 A | 10/1993 | Curhan et al. |
| 5,265,599 A | 11/1993 | Stephenson et al. |
| 5,278,936 A | 1/1994 | Shao |
| 5,279,128 A | 1/1994 | Tomatsu et al. |
| 5,335,381 A | 8/1994 | Chang |
| 5,367,728 A | 11/1994 | Chang |
| 5,372,402 A | 12/1994 | Kuo |
| 5,375,421 A | 12/1994 | Hsieh |
| 5,382,075 A | 1/1995 | Shih |
| 5,385,382 A | 1/1995 | Single, II et al. |
| 5,409,547 A | 4/1995 | Watanabe et al. |
| 5,413,166 A | 5/1995 | Kerner et al. |
| 5,416,935 A | 5/1995 | Nieh |
| 5,419,489 A | 5/1995 | Burd |
| 5,419,780 A | 5/1995 | Suski |
| 5,430,322 A | 7/1995 | Koyanagi et al. |
| 5,448,788 A | 9/1995 | Wu |
| 5,448,891 A | 9/1995 | Nakagiri et al. |
| 5,456,081 A | 10/1995 | Chrysler et al. |
| 5,473,783 A | 12/1995 | Allen |
| 5,493,742 A | 2/1996 | Klearman |
| 5,493,864 A | 2/1996 | Pomerence et al. |
| 5,497,632 A | 3/1996 | Robinson |
| 5,505,520 A | 4/1996 | Frusti et al. |
| 5,515,238 A | 5/1996 | Fritz et al. |
| 5,524,439 A | 6/1996 | Gallup et al. |
| 5,542,503 A | 8/1996 | Dunn et al. |
| 5,544,487 A | 8/1996 | Attey et al. |
| 5,544,488 A | 8/1996 | Reid |
| 5,555,732 A | 9/1996 | Whiticar |
| 5,561,981 A | 10/1996 | Quisenberry et al. |
| 5,576,512 A | 11/1996 | Doke |
| 5,584,084 A | 12/1996 | Klearman et al. |
| 5,584,183 A | 12/1996 | Wright et al. |
| 5,597,200 A | 1/1997 | Gregory et al. |
| 5,601,399 A | 2/1997 | Okpara et al. |
| 5,606,639 A | 2/1997 | Lehoe et al. |
| 5,613,729 A | 3/1997 | Summer, Jr. |
| 5,613,730 A | 3/1997 | Buie et al. |
| 5,623,828 A | 4/1997 | Harrington |
| 5,626,021 A | 5/1997 | Karunasiri et al. |
| 5,626,386 A | 5/1997 | Lush |
| 5,634,342 A | 6/1997 | Peeters et al. |
| 5,637,921 A | 6/1997 | Burward-Hoy |
| 5,640,728 A | 6/1997 | Graebe |
| 5,642,539 A | 7/1997 | Kuo |
| 5,645,314 A | 7/1997 | Liou |
| 5,650,904 A | 7/1997 | Gilley et al. |
| 5,653,741 A | 8/1997 | Grant |
| 5,667,622 A | 9/1997 | Hasegawa et al. |
| 5,675,852 A | 10/1997 | Watkins |
| 5,690,849 A | 11/1997 | DeVilbiss et al. |
| 5,692,952 A | 12/1997 | Chih-Hung |
| 5,704,213 A | 1/1998 | Smith et al. |
| 5,715,695 A | 2/1998 | Lord |
| 5,721,804 A | 2/1998 | Greene, III |
| 5,724,818 A | 3/1998 | Iwata et al. |
| 5,729,981 A | 3/1998 | Markus et al. |
| 5,761,908 A | 6/1998 | Oas et al. |
| 5,761,909 A | 6/1998 | Hughes et al. |
| 5,798,583 A | 8/1998 | Morita |
| 5,800,490 A | 9/1998 | Patz et al. |
| 5,802,855 A | 9/1998 | Yamaguchi et al. |
| 5,802,856 A | 9/1998 | Schaper et al. |
| 5,822,993 A | 10/1998 | Attey |
| 5,827,424 A | 10/1998 | Gillis et al. |
| 5,833,321 A | 11/1998 | Kim et al. |
| 5,850,741 A | 12/1998 | Feher |
| 5,865,031 A | 2/1999 | Itakura |
| 5,871,151 A | 2/1999 | Fiedrich |
| 5,884,485 A | 3/1999 | Yamaguchi et al. |
| 5,884,486 A | 3/1999 | Hughes et al. |
| 5,887,304 A | 3/1999 | Von der Heyde |
| 5,888,261 A | 3/1999 | Fortune |
| 5,895,964 A | 4/1999 | Nakayama |
| 5,902,014 A | 5/1999 | Dinkel et al. |
| 5,921,100 A | 7/1999 | Yoshinori et al. |
| 5,921,314 A | 7/1999 | Schuller et al. |
| 5,921,858 A | 7/1999 | Kawai et al. |
| 5,924,289 A | 7/1999 | Bishop, II |
| 5,924,766 A | 7/1999 | Esaki et al. |
| 5,924,767 A | 7/1999 | Pietiyga |
| 5,927,817 A | 7/1999 | Ekman et al. |
| 5,934,748 A | 8/1999 | Faust et al. |
| 5,936,192 A | 8/1999 | Tauchi |
| 5,937,908 A | 8/1999 | Inoshiri et al. |
| 5,948,303 A | 9/1999 | Larson |
| 5,950,067 A | 9/1999 | Maegawa et al. |
| 5,952,728 A | 9/1999 | Imanishi et al. |
| 5,987,893 A | 11/1999 | Schulz-Harder et al. |
| 5,988,568 A | 11/1999 | Drews |
| 5,992,154 A | 11/1999 | Kawada et al. |
| 5,994,637 A | 11/1999 | Imanushi et al. |
| 5,995,711 A | 11/1999 | Fukuoka et al. |
| 6,000,225 A | 12/1999 | Ghoshal |
| 6,003,950 A | 12/1999 | Larsson |
| 6,006,524 A | 12/1999 | Park |
| 6,019,420 A | 2/2000 | Faust et al. |
| 6,038,865 A | 3/2000 | Watanabe et al. |
| 6,048,024 A | 4/2000 | Wallman |
| 6,049,655 A | 4/2000 | Vazirani |
| 6,052,853 A | 4/2000 | Schmid |
| 6,053,163 A | 4/2000 | Bass |
| 6,059,018 A | 5/2000 | Yoshinori et al. |
| 6,062,641 A | 5/2000 | Suzuki et al. |
| 6,072,924 A | 6/2000 | Sato et al. |
| 6,072,938 A | 6/2000 | Peterson et al. |
| 6,073,998 A | 6/2000 | Siarkowski et al. |
| 6,079,485 A | 6/2000 | Esaki et al. |
| 6,084,172 A | 7/2000 | Kishi et al. |
| 6,085,369 A | 7/2000 | Feher |
| 6,086,831 A | 7/2000 | Harness et al. |
| 6,087,638 A | 7/2000 | Silverbrook |
| 6,094,919 A | 8/2000 | Bhatia |
| 6,097,088 A | 8/2000 | Sakuragi |
| 6,100,463 A | 8/2000 | Ladd et al. |
| 6,101,815 A | 8/2000 | Van Oort et al. |
| 6,105,373 A | 8/2000 | Watanabe et al. |
| 6,109,688 A | 8/2000 | Wurz et al. |
| 6,112,525 A | 9/2000 | Yoshida et al. |
| 6,112,531 A | 9/2000 | Yamaguchi |
| 6,116,029 A | 9/2000 | Krawec |
| 6,119,463 A | 9/2000 | Bell |
| 6,120,370 A | 9/2000 | Asou et al. |
| 6,127,619 A | 10/2000 | Xi et al. |
| 6,141,969 A | 11/2000 | Launchbury et al. |
| 6,145,925 A | 11/2000 | Eksin et al. |
| 6,158,224 A | 12/2000 | Hu et al. |
| 6,161,241 A | 12/2000 | Zysman |
| 6,161,388 A | 12/2000 | Ghoshal |
| 6,164,076 A | 12/2000 | Chu et al. |
| 6,164,719 A | 12/2000 | Rauh |
| 6,171,333 B1 | 1/2001 | Nelson et al. |
| 6,178,292 B1 | 1/2001 | Fukuoka et al. |
| 6,179,706 B1 | 1/2001 | Yoshinori et al. |
| 6,186,592 B1 | 2/2001 | Orizakis et al. |
| 6,189,966 B1 | 2/2001 | Faust et al. |
| 6,189,967 B1 | 2/2001 | Short |
| 6,196,627 B1 | 3/2001 | Faust et al. |
| 6,196,839 B1 | 3/2001 | Ross |
| 6,206,465 B1 | 3/2001 | Faust et al. |
| 6,213,198 B1 | 4/2001 | Shikata et al. |
| 6,222,243 B1 | 4/2001 | Kishi et al. |
| 6,223,539 B1 | 5/2001 | Bell |
| 6,233,959 B1 | 5/2001 | Kang et al. |
| 6,250,083 B1 | 6/2001 | Chou |
| 6,256,996 B1 | 7/2001 | Ghoshal |
| 6,262,357 B1 | 7/2001 | Johnson et al. |
| 6,263,530 B1 | 7/2001 | Feher |
| 6,266,962 B1 | 7/2001 | Ghoshal |
| 6,282,907 B1 | 9/2001 | Ghoshal |
| 6,289,982 B1 | 9/2001 | Naji |

(56) References Cited

U.S. PATENT DOCUMENTS

| | | |
|---|---|---|
| 6,291,803 B1 | 9/2001 | Fourrey |
| 6,306,673 B1 | 10/2001 | Imanishi et al. |
| 6,326,610 B1 | 12/2001 | Muramatsu et al. |
| 6,336,237 B1 | 1/2002 | Schmid |
| 6,338,251 B1 | 1/2002 | Ghoshal |
| 6,341,395 B1 | 1/2002 | Chao |
| 6,347,521 B1 | 2/2002 | Kadotani et al. |
| 6,378,311 B1 | 4/2002 | McCordic |
| 6,385,976 B1 | 5/2002 | Yamamura et al. |
| 6,391,676 B1 | 5/2002 | Tsuzaki et al. |
| 6,393,842 B2 | 5/2002 | Kim et al. |
| 6,400,013 B1 | 6/2002 | Tsuzaki et al. |
| 6,402,470 B1 | 6/2002 | Kvasnak et al. |
| 6,410,971 B1 | 6/2002 | Otey |
| 6,425,527 B1 | 7/2002 | Smole |
| 6,427,449 B1 | 8/2002 | Logan et al. |
| 6,434,328 B2 | 8/2002 | Rutherford |
| 6,452,740 B1 | 9/2002 | Ghoshal |
| 6,470,696 B1 | 10/2002 | Palfy et al. |
| 6,474,073 B1 | 11/2002 | Uetsuji et al. |
| 6,481,801 B1 | 11/2002 | Schmale |
| 6,487,739 B1 | 12/2002 | Harker |
| 6,489,551 B2 | 12/2002 | Chu et al. |
| 6,490,879 B1 | 12/2002 | Lloyd et al. |
| 6,492,585 B1 | 12/2002 | Zamboni et al. |
| 6,493,888 B1 | 12/2002 | Saivatini et al. |
| 6,493,889 B2 | 12/2002 | Kocurek |
| 6,509,704 B1 | 1/2003 | Brown |
| 6,511,125 B1 | 1/2003 | Gendron |
| 6,519,949 B1 | 2/2003 | Wernlund et al. |
| 6,539,725 B2 | 4/2003 | Bell |
| 6,541,737 B1 | 4/2003 | Eksin et al. |
| 6,541,743 B2 | 4/2003 | Chen |
| 6,546,576 B1 | 4/2003 | Lin |
| 6,548,894 B2 | 4/2003 | Chu et al. |
| 6,552,256 B2 | 4/2003 | Shakouri et al. |
| RE38,128 E | 6/2003 | Gallup et al. |
| 6,571,564 B2 | 6/2003 | Upadhye et al. |
| 6,573,596 B2 | 6/2003 | Saika |
| 6,574,967 B1 | 6/2003 | Park et al. |
| 6,580,025 B2 | 6/2003 | Guy |
| 6,581,225 B1 | 6/2003 | Imai |
| 6,583,638 B2 | 6/2003 | Costello et al. |
| 6,598,251 B2 | 7/2003 | Habboub et al. |
| 6,598,405 B2 | 7/2003 | Bell |
| 6,604,576 B2 | 8/2003 | Noda et al. |
| 6,604,785 B2 | 8/2003 | Bargheer et al. |
| 6,605,955 B1 | 8/2003 | Costello et al. |
| 6,606,754 B1 | 8/2003 | Flick |
| 6,606,866 B2 | 8/2003 | Bell |
| 6,619,044 B2 | 9/2003 | Batchelor et al. |
| 6,619,736 B2 | 9/2003 | Stowe et al. |
| 6,625,990 B2 | 9/2003 | Bell |
| 6,626,488 B2 | 9/2003 | Pfahler |
| 6,629,724 B2 | 10/2003 | Ekern et al. |
| 6,637,210 B2 | 10/2003 | Bell |
| 6,644,735 B2 | 11/2003 | Bargheer et al. |
| 6,672,076 B2 | 1/2004 | Bell |
| 6,676,207 B2 | 1/2004 | Rauh et al. |
| 6,684,437 B2 | 2/2004 | Koenig |
| 6,686,532 B1 | 2/2004 | Macris |
| 6,687,937 B2 | 2/2004 | Harker |
| 6,695,402 B2 | 2/2004 | Sloan, Jr. |
| 6,700,052 B2 | 3/2004 | Bell |
| 6,705,089 B2 | 3/2004 | Chu et al. |
| 6,708,352 B2 | 3/2004 | Salvatini et al. |
| 6,711,767 B2 | 3/2004 | Klamm |
| 6,711,904 B1 | 3/2004 | Law et al. |
| 6,719,039 B2 | 4/2004 | Calaman et al. |
| 6,725,669 B2 | 4/2004 | Melaragni |
| 6,727,422 B2 | 4/2004 | Macris |
| 6,730,115 B1 | 5/2004 | Heaton |
| 6,739,138 B2 | 5/2004 | Saunders et al. |
| 6,739,655 B1 | 5/2004 | Schwochert et al. |
| 6,743,972 B2 | 6/2004 | Macris |
| 6,761,399 B2 | 7/2004 | Bargheer et al. |
| 6,764,502 B2 | 7/2004 | Bieberich |
| 6,767,766 B2 | 7/2004 | Chu et al. |
| 6,772,829 B2 | 8/2004 | Lebrun |
| 6,774,346 B2 | 8/2004 | Clothier |
| 6,786,541 B2 | 9/2004 | Haupt et al. |
| 6,786,545 B2 | 9/2004 | Bargheer et al. |
| 6,790,481 B2 | 9/2004 | Bishop et al. |
| 6,793,016 B2 | 9/2004 | Aoki et al. |
| 6,804,966 B1 | 10/2004 | Chu et al. |
| 6,808,230 B2 | 10/2004 | Buss et al. |
| 6,812,395 B2 | 11/2004 | Bell |
| 6,815,814 B2 | 11/2004 | Chu et al. |
| 6,817,191 B2 | 11/2004 | Watanabe |
| 6,817,197 B1 | 11/2004 | Padfield |
| 6,817,675 B2 | 11/2004 | Buss et al. |
| 6,818,817 B2 | 11/2004 | Macris |
| 6,823,678 B1 | 11/2004 | Li |
| 6,828,528 B2 | 12/2004 | Stowe et al. |
| 6,834,509 B2 | 12/2004 | Palfy et al. |
| 6,840,305 B2 | 1/2005 | Zheng et al. |
| 6,840,576 B2 | 1/2005 | Ekern et al. |
| 6,841,957 B2 | 1/2005 | Brown |
| 6,845,622 B2 | 1/2005 | Sauciuc et al. |
| 6,855,158 B2 | 2/2005 | Stolpmann |
| 6,855,880 B2 | 2/2005 | Feher |
| 6,857,697 B2 | 2/2005 | Brennan et al. |
| 6,857,954 B2 | 2/2005 | Luedtke |
| 6,868,690 B2 | 3/2005 | Faqih |
| 6,871,365 B2 | 3/2005 | Flick et al. |
| 6,886,351 B2 | 5/2005 | Palfy et al. |
| 6,892,807 B2 | 5/2005 | Fristedt et al. |
| 6,893,086 B2 | 5/2005 | Bajic et al. |
| 6,904,629 B2 | 6/2005 | Wu |
| 6,907,739 B2 | 6/2005 | Bell |
| 6,923,216 B2 | 8/2005 | Extrand et al. |
| 6,935,122 B2 | 8/2005 | Huang |
| 6,954,944 B2 | 10/2005 | Feher |
| 6,959,555 B2 | 11/2005 | Bell |
| 6,962,195 B2 | 11/2005 | Smith et al. |
| 6,963,053 B2 | 11/2005 | Lutz |
| 6,967,309 B2 | 11/2005 | Wyatt et al. |
| 6,976,734 B2 | 12/2005 | Stoewe |
| 6,977,360 B2 | 12/2005 | Weiss |
| 6,981,380 B2 | 1/2006 | Chrysler et al. |
| 6,990,701 B1 | 1/2006 | Litvak |
| 7,000,490 B1 | 2/2006 | Micheels |
| 7,036,163 B2 | 5/2006 | Schmid |
| 7,040,710 B2 | 5/2006 | White et al. |
| 7,052,091 B2 | 5/2006 | Bajic et al. |
| 7,063,163 B2 | 6/2006 | Steele et al. |
| 7,066,306 B2 | 6/2006 | Gavin |
| 7,070,231 B1 | 7/2006 | Wong |
| 7,070,232 B2 | 7/2006 | Minegishi et al. |
| 7,075,034 B2 | 7/2006 | Bargheer et al. |
| 7,082,772 B2 | 8/2006 | Welch |
| 7,084,502 B2 | 8/2006 | Bottner et al. |
| 7,100,978 B2 | 9/2006 | Ekern et al. |
| 7,108,319 B2 | 9/2006 | Hartwich et al. |
| 7,111,465 B2 | 9/2006 | Bell |
| 7,114,771 B2 | 10/2006 | Lofy et al. |
| 7,124,593 B2 | 10/2006 | Feher |
| 7,131,689 B2 | 11/2006 | Brennan et al. |
| 7,134,715 B1 | 11/2006 | Fristedt et al. |
| 7,141,763 B2 | 11/2006 | Moroz |
| 7,147,279 B2 | 12/2006 | Bevan et al. |
| 7,165,281 B2 | 1/2007 | Larssson et al. |
| 7,168,758 B2 | 1/2007 | Bevan et al. |
| 7,178,344 B2 | 2/2007 | Bell |
| 7,201,441 B2 | 4/2007 | Stoewe et al. |
| 7,213,876 B2 | 5/2007 | Stoewe |
| 7,220,048 B2 | 5/2007 | Kohlgrüber et al. |
| 7,224,059 B2 | 5/2007 | Shimada et al. |
| 7,231,772 B2 | 6/2007 | Bell |
| 7,244,887 B2 | 7/2007 | Miley |
| 7,246,496 B2 | 7/2007 | Goenka et al. |
| 7,272,936 B2 | 9/2007 | Feher |
| 7,273,981 B2 | 9/2007 | Bell |
| 7,299,639 B2 | 11/2007 | Leija et al. |

(56) References Cited

U.S. PATENT DOCUMENTS

| | | |
|---|---|---|
| 7,337,615 B2 | 3/2008 | Reidy |
| 7,338,117 B2 | 3/2008 | Iqbal et al. |
| 7,340,907 B2 | 3/2008 | Vogh et al. |
| 7,355,146 B2 | 4/2008 | Angelis et al. |
| 7,356,912 B2 | 4/2008 | Iqbal et al. |
| 7,360,365 B2 | 4/2008 | Codecasa et al. |
| 7,360,416 B2 | 4/2008 | Manaka et al. |
| 7,370,479 B2 | 5/2008 | Pfannenberg |
| 7,370,911 B2 | 5/2008 | Bajic et al. |
| 7,380,586 B2 | 6/2008 | Gawthrop |
| 7,425,034 B2 | 9/2008 | Bajic et al. |
| 7,426,835 B2 | 9/2008 | Bell et al. |
| 7,462,028 B2 | 12/2008 | Cherala et al. |
| 7,469,432 B2 | 12/2008 | Chambers |
| 7,475,464 B2 | 1/2009 | Lofy et al. |
| 7,475,938 B2 | 1/2009 | Stoewe et al. |
| 7,478,869 B2 | 1/2009 | Lazanja et al. |
| 7,480,950 B2 | 1/2009 | Feher |
| 7,506,924 B2 | 3/2009 | Bargheer et al. |
| 7,506,938 B2 | 3/2009 | Brennan et al. |
| 7,513,273 B2 | 4/2009 | Bivin |
| 7,581,785 B2 | 9/2009 | Heckmann et al. |
| 7,587,901 B2 | 9/2009 | Petrovski |
| 7,587,902 B2 | 9/2009 | Bell |
| 7,591,507 B2 | 9/2009 | Giffin et al. |
| 7,608,777 B2 | 10/2009 | Bell et al. |
| 7,621,594 B2 | 11/2009 | Hartmann et al. |
| 7,640,754 B2 | 1/2010 | Wolas |
| 7,665,803 B2 | 2/2010 | Wolas |
| 7,708,338 B2 | 5/2010 | Wolas |
| 7,731,279 B2 | 6/2010 | Asada et al. |
| RE41,765 E | 9/2010 | Gregory et al. |
| 7,827,620 B2 | 11/2010 | Feher |
| 7,827,805 B2 | 11/2010 | Comiskey et al. |
| 7,862,113 B2 | 1/2011 | Knoll |
| 7,866,017 B2 | 1/2011 | Knoll |
| 7,877,827 B2 | 2/2011 | Marquette et al. |
| 7,927,805 B2 | 4/2011 | Raponi et al. |
| 7,937,789 B2 | 5/2011 | Feher |
| 7,963,594 B2 | 6/2011 | Wolas |
| 7,966,835 B2 | 6/2011 | Petrovski |
| 7,969,738 B2 | 6/2011 | Koo |
| 7,996,936 B2 | 8/2011 | Marquette et al. |
| 8,062,797 B2 | 11/2011 | Fisher et al. |
| 8,065,763 B2 | 11/2011 | Brykalski et al. |
| 8,104,295 B2 | 1/2012 | Lofy |
| 8,143,554 B2 | 3/2012 | Lofy |
| 8,181,290 B2 | 5/2012 | Brykalski et al. |
| 8,191,187 B2 | 5/2012 | Brykaiski et al. |
| 8,222,511 B2 | 7/2012 | Lofy |
| 8,256,236 B2 | 9/2012 | Lofy |
| 8,332,975 B2 | 12/2012 | Brykalski et al. |
| 8,402,579 B2 | 3/2013 | Marquette et al. |
| 8,418,286 B2 | 4/2013 | Brykalski et al. |
| 8,434,314 B2 | 5/2013 | Comiskey et al. |
| 8,438,863 B2 | 5/2013 | Lofy |
| RE44,272 E | 6/2013 | Bell |
| 8,505,320 B2 | 8/2013 | Lofy |
| 8,516,842 B2 | 8/2013 | Petrovski |
| 8,539,624 B2 | 9/2013 | Terech et al. |
| 8,575,518 B2 | 11/2013 | Walsh |
| 8,621,687 B2 | 1/2014 | Brykalski et al. |
| 8,722,222 B2 | 5/2014 | Kossakovski et al. |
| 8,732,874 B2 | 5/2014 | Brykalski et al. |
| 8,782,830 B2 | 7/2014 | Brykalski et al. |
| 8,893,329 B2 | 11/2014 | Petrovski et al. |
| 9,105,808 B2 | 8/2015 | Petrovski |
| 9,105,809 B2 | 8/2015 | Lofy |
| 9,121,414 B2 | 9/2015 | Lofy et al. |
| 9,125,497 B2 | 9/2015 | Brykalski et al. |
| 9,310,112 B2 | 4/2016 | Bell et al. |
| 9,335,073 B2 | 5/2016 | Lofy |
| 9,445,524 B2 | 9/2016 | Lofy et al. |
| 9,451,723 B2 | 9/2016 | Lofy et al. |
| 9,603,459 B2 | 3/2017 | Brykalski et al. |
| 9,622,588 B2 | 4/2017 | Brykalski et al. |
| 9,651,279 B2 | 5/2017 | Lofy |
| 9,662,962 B2 | 5/2017 | Steinman et al. |
| 9,671,142 B2 | 6/2017 | Kossakovski et al. |
| 9,685,599 B2 | 6/2017 | Petrovski et al. |
| 9,814,641 B2 | 11/2017 | Brykalski et al. |
| 9,857,107 B2 | 1/2018 | Inaba et al. |
| 9,989,267 B2 | 6/2018 | Brykalski et al. |
| 10,005,337 B2 | 6/2018 | Petrovski |
| 2001/0005990 A1 | 7/2001 | Kim et al. |
| 2001/0014212 A1 | 8/2001 | Rutherford |
| 2001/0028185 A1 | 10/2001 | Stowe et al. |
| 2002/0017102 A1 | 2/2002 | Bell |
| 2002/0026226 A1 | 2/2002 | Ein |
| 2002/0062854 A1 | 5/2002 | Sharp |
| 2002/0092308 A1 | 7/2002 | Bell |
| 2002/0100121 A1 | 8/2002 | Kocurek |
| 2002/0108380 A1 | 8/2002 | Nielsen et al. |
| 2002/0121094 A1 | 9/2002 | VanHoudt |
| 2002/0195844 A1 | 12/2002 | Hipwell |
| 2003/0019044 A1 | 1/2003 | Larsson et al. |
| 2003/0039298 A1 | 2/2003 | Eriksson et al. |
| 2003/0041892 A1 | 3/2003 | Fleurial et al. |
| 2003/0070235 A1 | 4/2003 | Suzuki et al. |
| 2003/0084511 A1 | 5/2003 | Salvatini et al. |
| 2003/0110779 A1 | 6/2003 | Otey et al. |
| 2003/0133492 A1 | 7/2003 | Watanabe |
| 2003/0145380 A1 | 8/2003 | Schmid |
| 2003/0150060 A1 | 8/2003 | Huang |
| 2003/0160479 A1 | 8/2003 | Minuth et al. |
| 2003/0188382 A1 | 10/2003 | Klamm et al. |
| 2003/0234247 A1 | 12/2003 | Stern |
| 2004/0090093 A1 | 5/2004 | Kamiya et al. |
| 2004/0098991 A1 | 5/2004 | Heyes |
| 2004/0113549 A1 | 6/2004 | Roberts et al. |
| 2004/0164594 A1 | 8/2004 | Stoewe et al. |
| 2004/0177622 A1 | 9/2004 | Harvie |
| 2004/0177876 A1 | 9/2004 | Hightower |
| 2004/0177877 A1 | 9/2004 | Hightower |
| 2004/0195870 A1 | 10/2004 | Bohlender |
| 2004/0238022 A1 | 12/2004 | Hiller et al. |
| 2004/0255364 A1 | 12/2004 | Feher |
| 2005/0011009 A1 | 1/2005 | Wu |
| 2005/0012204 A1 | 1/2005 | Strnad |
| 2005/0056310 A1 | 3/2005 | Shikata et al. |
| 2005/0067862 A1 | 3/2005 | Iqbal et al. |
| 2005/0072165 A1 | 4/2005 | Bell |
| 2005/0076944 A1 | 4/2005 | Kanatzidis et al. |
| 2005/0078451 A1 | 4/2005 | Sauciuc et al. |
| 2005/0086739 A1 | 4/2005 | Wu |
| 2005/0121065 A1 | 6/2005 | Otey |
| 2005/0126184 A1 | 6/2005 | Cauchy |
| 2005/0140180 A1 | 6/2005 | Hesch |
| 2005/0143797 A1 | 6/2005 | Parish et al. |
| 2005/0145285 A1 | 7/2005 | Extrand |
| 2005/0161072 A1 | 7/2005 | Esser et al. |
| 2005/0173950 A1 | 8/2005 | Bajic et al. |
| 2005/0200166 A1 | 9/2005 | Noh |
| 2005/0202774 A1 | 9/2005 | Lipke |
| 2005/0220167 A1 | 10/2005 | Kanai et al. |
| 2005/0251120 A1 | 11/2005 | Anderson et al. |
| 2005/0257532 A1 | 11/2005 | Ikeda et al. |
| 2005/0268956 A1 | 12/2005 | Take |
| 2005/0278863 A1 | 12/2005 | Bahash et al. |
| 2005/0285438 A1 | 12/2005 | Ishima et al. |
| 2005/0288749 A1 | 12/2005 | Lachenbruch |
| 2006/0005548 A1 | 1/2006 | Ruckstuhl |
| 2006/0005944 A1 | 1/2006 | Wang et al. |
| 2006/0053529 A1 | 3/2006 | Feher |
| 2006/0078319 A1 | 4/2006 | Maran |
| 2006/0080778 A1 | 4/2006 | Chambers |
| 2006/0087160 A1 | 4/2006 | Dong et al. |
| 2006/0102224 A1 | 5/2006 | Chen et al. |
| 2006/0118158 A1 | 6/2006 | Zhang et al. |
| 2006/0123799 A1 | 6/2006 | Tateyama et al. |
| 2006/0137099 A1 | 6/2006 | Feher |
| 2006/0137358 A1 | 6/2006 | Feher |
| 2006/0157102 A1 | 7/2006 | Nakajima et al. |
| 2006/0158011 A1 | 7/2006 | Marlovits et al. |

(56) References Cited

U.S. PATENT DOCUMENTS

| | | |
|---|---|---|
| 2006/0162074 A1 | 7/2006 | Bader |
| 2006/0175877 A1 | 8/2006 | Alionte et al. |
| 2006/0197363 A1 | 9/2006 | Lofy et al. |
| 2006/0200398 A1 | 9/2006 | Botton et al. |
| 2006/0201161 A1 | 9/2006 | Hirai et al. |
| 2006/0201162 A1 | 9/2006 | Hsieh |
| 2006/0214480 A1 | 9/2006 | Terech |
| 2006/0219699 A1 | 10/2006 | Geisel et al. |
| 2006/0225441 A1 | 10/2006 | Goenka et al. |
| 2006/0225773 A1 | 10/2006 | Venkatasubramanian et al. |
| 2006/0237166 A1 | 10/2006 | Otey et al. |
| 2006/0243317 A1 | 11/2006 | Venkatasubramanian |
| 2006/0244289 A1 | 11/2006 | Bedro |
| 2006/0273646 A1 | 12/2006 | Comiskey et al. |
| 2007/0017666 A1 | 1/2007 | Goenka et al. |
| 2007/0035162 A1 | 2/2007 | Bier et al. |
| 2007/0040421 A1 | 2/2007 | Zuzga et al. |
| 2007/0069554 A1 | 3/2007 | Comiskey et al. |
| 2007/0086757 A1 | 4/2007 | Feher |
| 2007/0095378 A1 | 5/2007 | Ito et al. |
| 2007/0095383 A1 | 5/2007 | Tajima |
| 2007/0101602 A1 | 5/2007 | Bae et al. |
| 2007/0107450 A1 | 5/2007 | Sasao et al. |
| 2007/0138844 A1 | 6/2007 | Kim |
| 2007/0142883 A1 | 6/2007 | Quincy, III |
| 2007/0145808 A1 | 6/2007 | Minuth et al. |
| 2007/0157630 A1 | 7/2007 | Kadle et al. |
| 2007/0158981 A1 | 7/2007 | Almasi et al. |
| 2007/0163269 A1 | 7/2007 | Chung et al. |
| 2007/0190712 A1 | 8/2007 | Lin et al. |
| 2007/0193279 A1 | 8/2007 | Yoneno et al. |
| 2007/0200398 A1 | 8/2007 | Wolas et al. |
| 2007/0214956 A1 | 9/2007 | Carlson et al. |
| 2007/0227158 A1 | 10/2007 | Kuchimachi |
| 2007/0234742 A1 | 10/2007 | Aoki et al. |
| 2007/0241592 A1 | 10/2007 | Giffin et al. |
| 2007/0251016 A1 | 11/2007 | Feher |
| 2007/0251548 A1 | 11/2007 | Vrzalik et al. |
| 2007/0252621 A1 | 11/2007 | Doug et al. |
| 2007/0256722 A1 | 11/2007 | Kondoh |
| 2007/0261412 A1 | 11/2007 | Heine |
| 2007/0261413 A1 | 11/2007 | Hatamian et al. |
| 2007/0296251 A1 | 12/2007 | Krobok et al. |
| 2008/0000025 A1 | 1/2008 | Feher |
| 2008/0022694 A1 | 1/2008 | Anderson et al. |
| 2008/0023056 A1 | 1/2008 | Kambe et al. |
| 2008/0028536 A1 | 2/2008 | Hadden-Cook |
| 2008/0028768 A1 | 2/2008 | Goenka |
| 2008/0028769 A1 | 2/2008 | Goenka |
| 2008/0053108 A1 | 3/2008 | Wen |
| 2008/0053509 A1 | 3/2008 | Flitsch et al. |
| 2008/0077211 A1 | 3/2008 | Levinson et al. |
| 2008/0078186 A1 | 4/2008 | Cao |
| 2008/0084095 A1 | 4/2008 | Wolas |
| 2008/0087316 A1 | 4/2008 | Inaba et al. |
| 2008/0154518 A1 | 6/2008 | Manaka et al. |
| 2008/0155990 A1 | 7/2008 | Gupta et al. |
| 2008/0163916 A1 | 7/2008 | Tsuneoka et al. |
| 2008/0164733 A1 | 7/2008 | Giffin et al. |
| 2008/0166224 A1 | 7/2008 | Giffin et al. |
| 2008/0245092 A1 | 10/2008 | Forsberg et al. |
| 2008/0263776 A1 | 10/2008 | O'Reagan |
| 2008/0289677 A1 | 11/2008 | Bell et al. |
| 2008/0307796 A1 | 12/2008 | Bell et al. |
| 2009/0000031 A1 | 1/2009 | Feher |
| 2009/0015042 A1 | 1/2009 | Bargheer et al. |
| 2009/0026813 A1 | 1/2009 | Lofy |
| 2009/0033130 A1 | 2/2009 | Marquette et al. |
| 2009/0106907 A1 | 4/2009 | Chambers |
| 2009/0108094 A1 | 4/2009 | Ivri |
| 2009/0126110 A1 | 5/2009 | Feher |
| 2009/0178700 A1 | 7/2009 | Heremans et al. |
| 2009/0211619 A1 | 8/2009 | Sharp et al. |
| 2009/0218855 A1 | 9/2009 | Wolas |
| 2009/0235969 A1 | 9/2009 | Heremans et al. |
| 2009/0269584 A1 | 10/2009 | Bell et al. |
| 2009/0293488 A1 | 12/2009 | Coughlan, III et al. |
| 2010/0132379 A1 | 6/2010 | Wu |
| 2010/0132380 A1 | 6/2010 | Robinson, II |
| 2010/0133883 A1 | 6/2010 | Walker |
| 2010/0153066 A1* | 6/2010 | Federer .............. B01L 7/52 702/181 |
| 2010/0154437 A1 | 6/2010 | Nepsha |
| 2010/0154911 A1 | 6/2010 | Yoskowitz |
| 2010/0198322 A1 | 8/2010 | Joseph et al. |
| 2010/0307168 A1 | 12/2010 | Kohl et al. |
| 2011/0066217 A1 | 3/2011 | Diller et al. |
| 2011/0101741 A1 | 5/2011 | Kolich |
| 2011/0271994 A1 | 11/2011 | Gilley |
| 2011/0289684 A1 | 12/2011 | Parish et al. |
| 2012/0003510 A1 | 1/2012 | Eisenhour |
| 2012/0017371 A1 | 1/2012 | Pollard |
| 2012/0080911 A1 | 4/2012 | Brykalski et al. |
| 2012/0235444 A1 | 9/2012 | Dilley et al. |
| 2012/0239123 A1 | 9/2012 | Weber et al. |
| 2012/0261399 A1 | 10/2012 | Lofy |
| 2012/0289761 A1 | 11/2012 | Boyden et al. |
| 2013/0097777 A1 | 4/2013 | Marquette et al. |
| 2013/0125563 A1 | 5/2013 | Jun |
| 2013/0206852 A1 | 8/2013 | Brykalski et al. |
| 2013/0232996 A1 | 9/2013 | Goenka et al. |
| 2013/0239592 A1 | 9/2013 | Lofy |
| 2014/0026320 A1 | 1/2014 | Marquette et al. |
| 2014/0030082 A1 | 1/2014 | Heimenstein |
| 2014/0090513 A1 | 4/2014 | Zhang et al. |
| 2014/0090829 A1 | 4/2014 | Petrovski |
| 2014/0113536 A1 | 4/2014 | Goenka et al. |
| 2014/0131343 A1 | 5/2014 | Walsh |
| 2014/0137569 A1 | 5/2014 | Parish et al. |
| 2014/0159442 A1 | 6/2014 | Helmenstein |
| 2014/0180493 A1 | 6/2014 | Csonti et al. |
| 2014/0187140 A1 | 7/2014 | Lazanja et al. |
| 2014/0194959 A1 | 7/2014 | Fries et al. |
| 2014/0237719 A1 | 8/2014 | Brykaiski et al. |
| 2014/0250918 A1 | 9/2014 | Lofy |
| 2014/0256244 A1 | 9/2014 | Sakurai et al. |
| 2014/0260331 A1 | 9/2014 | Lofy et al. |
| 2014/0305625 A1 | 10/2014 | Petrovski |
| 2014/0338366 A1 | 11/2014 | Adldinger et al. |
| 2015/0176870 A1 | 6/2015 | Inaba et al. |
| 2015/0238020 A1 | 8/2015 | Petrovski et al. |
| 2016/0030234 A1 | 2/2016 | Lofy et al. |
| 2016/0053772 A1 | 2/2016 | Lofy et al. |
| 2016/0137110 A1 | 5/2016 | Lofy et al. |
| 2016/0320104 A1 | 11/2016 | Lofy |
| 2017/0071359 A1 | 3/2017 | Petrovski et al. |
| 2017/0291467 A1 | 10/2017 | Steinman et al. |
| 2017/0314824 A1 | 11/2017 | Kossakovski et al. |
| 2018/0172325 A1 | 6/2018 | Inaba et al. |
| 2018/0213942 A1 | 8/2018 | Marquette et al. |

FOREIGN PATENT DOCUMENTS

| | | |
|---|---|---|
| CN | 1299950 | 6/2001 |
| CN | 1320087 | 10/2001 |
| CN | 1929761 | 3/2007 |
| CN | 101 219 025 | 7/2008 |
| DE | 195 03 291 | 9/1996 |
| DE | 199 12 764 | 9/2000 |
| DE | 299 11 519 | 11/2000 |
| DE | 102 38 552 | 8/2001 |
| DE | 101 15 242 | 10/2002 |
| DE | 201 20 516 | 4/2003 |
| DE | 10 2009 036 332 | 2/2011 |
| EP | 0 424 160 | 4/1991 |
| EP | 0 411 375 | 5/1994 |
| EP | 0 621 026 | 10/1994 |
| EP | 0 834 421 | 4/1998 |
| EP | 0 862 901 | 9/1998 |
| EP | 1 598 223 | 11/2005 |
| EP | 1 972 312 | 9/2008 |
| EP | 1 845 914 | 9/2009 |
| EP | 2 073 669 | 11/2012 |
| EP | 2 921 083 | 9/2015 |

(56) References Cited

FOREIGN PATENT DOCUMENTS

| | | |
|---|---|---|
| FR | 2 893 826 | 6/2007 |
| GB | 874660 | 8/1961 |
| GB | 978057 | 12/1964 |
| JP | 56-097416 | 8/1981 |
| JP | 60-080044 | 5/1985 |
| JP | 60-085297 | 5/1985 |
| JP | 01-281344 | 11/1989 |
| JP | 04052470 | 6/1990 |
| JP | 04-165234 | 6/1992 |
| JP | 05-026762 | 2/1993 |
| JP | 05-277020 | 10/1993 |
| JP | 10-044756 | 2/1998 |
| JP | 10-227508 | 8/1998 |
| JP | 10-297243 | 11/1998 |
| JP | 10-332883 | 12/1998 |
| JP | 2000-060681 | 2/2000 |
| JP | 2000-164945 | 6/2000 |
| JP | 2001-174028 | 6/2001 |
| JP | 2001-208405 | 8/2001 |
| JP | 2002-514735 | 5/2002 |
| JP | 2002-227798 | 8/2002 |
| JP | 2003-204087 | 7/2003 |
| JP | 2003-254636 | 9/2003 |
| JP | 2004-055621 | 2/2004 |
| JP | 2004-174138 | 6/2004 |
| JP | 2005-079210 | 2/2005 |
| JP | 2005-333083 | 12/2005 |
| JP | 2006-001392 | 1/2006 |
| JP | 2006-021572 | 1/2006 |
| JP | 2006-076398 | 3/2006 |
| KR | 2001-0060500 | 7/2001 |
| KR | 10-2005-0011494 | 1/2005 |
| LU | 66619 | 2/1973 |
| WO | WO 94/020801 | 9/1994 |
| WO | WO 95/014899 | 6/1995 |
| WO | WO 95/031688 | 11/1995 |
| WO | WO 96/005475 | 2/1996 |
| WO | WO 98/007898 | 2/1998 |
| WO | WO 98/0031311 | 7/1998 |
| WO | WO 99/023980 | 5/1999 |
| WO | WO 99/044552 | 9/1999 |
| WO | WO 99/058907 | 11/1999 |
| WO | WO 02/011968 | 2/2002 |
| WO | WO 02/053400 | 7/2002 |
| WO | WO 02/058165 | 7/2002 |
| WO | WO 03/014634 | 2/2003 |
| WO | WO 03/051666 | 6/2003 |
| WO | WO 03/063257 | 7/2003 |
| WO | WO 2004/011861 | 2/2004 |
| WO | WO 2005/115794 | 12/2005 |
| WO | WO 2006/078394 | 7/2006 |
| WO | WO 2007/060371 | 5/2007 |
| WO | WO 2007/089789 | 8/2007 |
| WO | WO 2008/045964 | 4/2008 |
| WO | WO 2008/046110 | 4/2008 |
| WO | WO 2008/057962 | 5/2008 |
| WO | WO 2008/076588 | 6/2008 |
| WO | WO 2008/086499 | 7/2008 |
| WO | WO 2008/115831 | 9/2008 |
| WO | WO 2009/015235 | 1/2009 |
| WO | WO 2009/036077 | 3/2009 |
| WO | WO 2009/097572 | 8/2009 |
| WO | WO 2010/009422 | 1/2010 |
| WO | WO 2010/088405 | 8/2010 |
| WO | WO 2010/129803 | 11/2010 |
| WO | WO 2011/026040 | 3/2011 |
| WO | WO 2011/156643 | 12/2011 |
| WO | WO 2012/061777 | 5/2012 |
| WO | WO 2013/052823 | 4/2013 |
| WO | WO 2014/164887 | 10/2014 |

OTHER PUBLICATIONS

U.S. Appl. No. 14/821,514, filed Aug. 7, 2015, Lofy.
U.S. Appl. No. 15/495,787, filed Apr. 24, 2017, Steinman et al.
U.S. Appl. No. 15/595,756, filed May 15, 2017, Kossakovski et al.
U.S. Appl. No. 15/685,912, filed Aug. 24, 2017, Petrovski et al.
Feher, Steve, "Thermoelectric Air Conditioned Variable Temperature Seat (VTS) & Effect Upon Vehicle Occupant Comfort, Vehicle Energy Efficiency, and Vehicle Environment Compatibility", SAE Technical Paper, Apr. 1993, pp. 341-349.
Lofy et al., "Thermoelectrics for Environmental Control in Automobiles", Proceeding of Twenty-First International Conference on Thermoelectrics (ICT 2002), 2002, pp. 471-476.
Photographs and accompanying description of climate control seat assembly system components publicly disclosed as early as Jan. 1998.
Photographs and accompanying description of a component of a climate control seat assembly system sold prior to Nov. 1, 2005.
Photographs and accompanying description of a component of a climate control seat assembly system sold prior to Dec. 20, 2003.
W.E.T.'s Answer, Affirmative Defenses, and Counterclaims to Amerigon's Complaint for Patent Infringement, May, 24, 2010.
Amerigon's Inc.'s Answer to W.E.T. Automotive Systems Limited's counterclaims, Jun. 17, 2010.
Defendant Amerigon's Motion to Dismiss Count VII of Plaintiff W.E.T. Automotive Systems, Ltd.'s Counterclaims, Jun. 17, 2010.
W.E.T.'s Answer, Affirmative Defenses, and Counterclaims to Amerigon's (Corrected) Amended Answer and Counterclaims for Patent Infringement, Jul. 8, 2010.
W.E.T.'s Answer, Affirmative Defenses, and First Amended Counterclaims (Count VII) to Amerigon's (Corrected) Amended Answer and Counterclaims for Patent Infringement at D/E 19, Jul. 16, 2010.
W.E.T.'s Opposition to Amerigon's Motion to Dismiss W.E.T.'s Inequitable Conduct Counterclaim, Jul. 16, 2010.
Amerigon's Inc.'s Answer to W.E.T. Automotive Systems Limited's Amended Counterclaims, Aug. 2, 2010.
Defendant Amerigon Inc.'s Motion to Dismiss Amended Count VII of Plaintiff W.E.T. Automotive Systems Ltd.'s Amended Counterclaims, Aug. 2, 2010.
Plantiff W.E.T.'s Responses to Defendant Amerigon Inc.'s First Set of Interrogatories (Nos. 1-5), Aug. 16, 2010.
W.E.T.'s Opposition to Amerigon's Motion to Dismiss Amended Count VII of Plaintiff W.E.T. Automotive Systems Ltd.'s Amended Counterclaims, Aug. 24, 2010.
Counterclaimant Amerigon Inc.'s Supplemental Answers to Counterclaim Defendant W.E.T.'s First Set of Interrogatories (Nos. 14-15), Aug. 27, 2010.
Defendant Amerigon Inc.'s Reply Brief in Support of Motion to Dismiss Amended Count VII of Plaintiff W.E.T. Automotive Systems' Amended Counterclaims, Aug. 31, 2010.
Amerigon, Inc. And Feher Design, Inc.'s Preliminary Proposed Claim Constructions, Sep. 24, 2010.
W.E.T.'s Proposed Definitions, Sep. 24, 2010.
Plaintiff W.E.T.'s Supplemental Responses to Defendant Amerigon Inc.'s Interrogatories Nos. 1-5., Oct. 8, 2010.
Amerigon Inc.'s Supplemental Answers to Interrogatory Nos. 1-5, 9-13, 15 of W.E.T.'s First Set of Interrogatories (Nos. 1-17), Oct. 8, 2010.
W.E.T.'s Motion to Bifurcate and Stay, Nov. 11, 2010.
W.E.T.'s Motion for Summary Judgment of Inequitable Conduct, Nov. 12, 2010.
Amerigon Inc.'s Notice of Conditional Withdrawal of Motion to Dismiss Amended Count VII of W.E.T. Automotive Systems Ltd.'s Amended Counterclaims, Dec. 16, 2010.
Japanese Office Action re JP Patent Application No. 2011-518941, dated Oct. 18, 2013 in 5 pages, along with its English translation as translated by a foreign associate.
International Search Report and Written Opinion received in PCT Application No, PCT/US2012/058993, dated Mar. 8, 2013.
International Preliminary Report on Patentability received in PCT Application No. PCT/US2012/058993, dated Apr. 8, 2014.
U.S. Appl. No. 15/842,535, filed Dec. 14, 2017, Inaba et al.
U.S. Appl. No. 15/880,433, filed Jan. 25, 2018, Marquette et al.
U.S. Appl. No. 15/994,275, filed May 31, 2018, Brykalski et al.

* cited by examiner

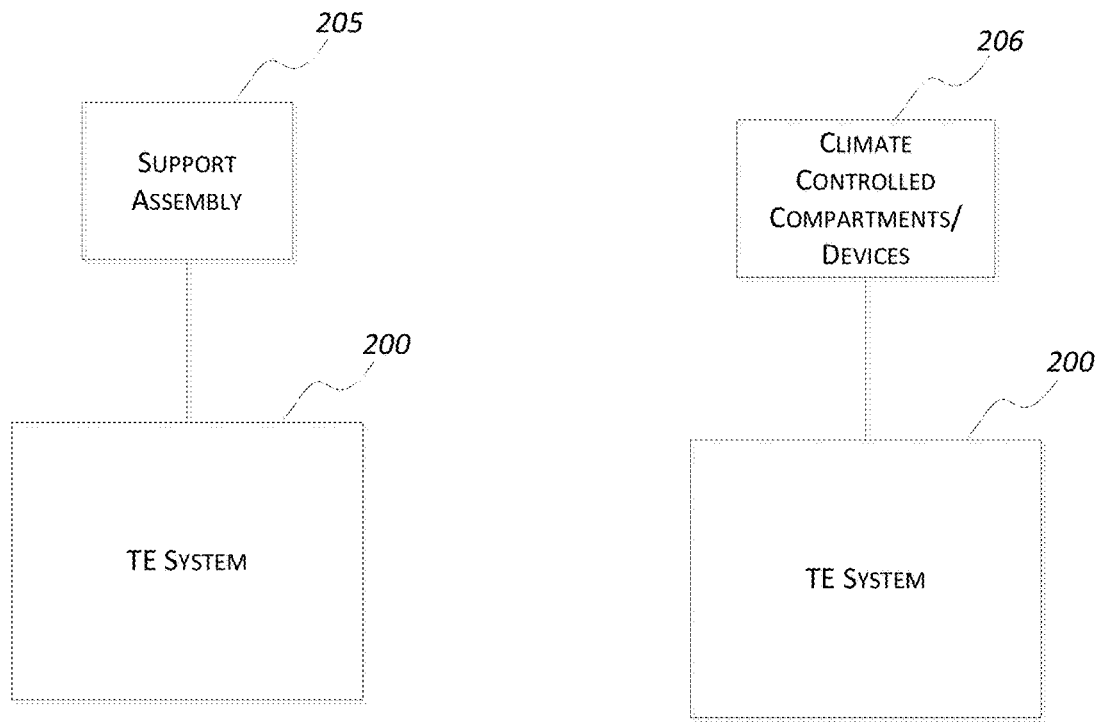
FIG. 9
FIG. 10
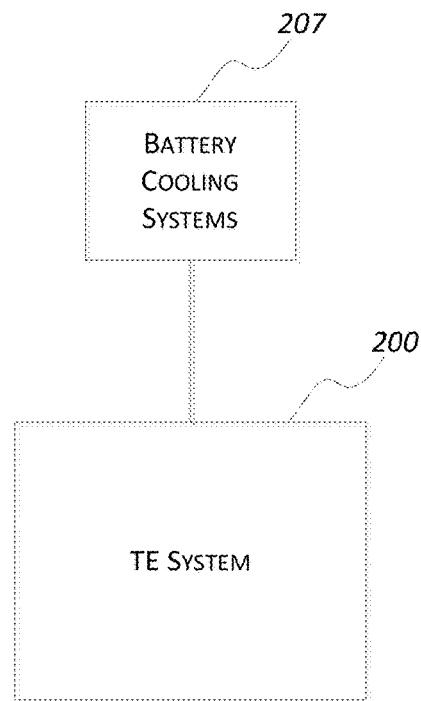
FIG. 11

THERMOELECTRIC DEVICE CONTROLS AND METHODS

CROSS-REFERENCE TO RELATED APPLICATIONS

This application is a continuation of U.S. patent application Ser. No. 13/646,581, filed Oct. 5, 2012, which claims the priority benefit under 35 U.S.C. § 119(e) of U.S. Provisional Application No. 61/545,017, filed Oct. 7, 2011, the entirety of each which is hereby incorporated by reference.

FIELD

The present disclosure relates to thermoelectric (TE) systems and the control of one or more TE devices, and certain embodiments are particularly directed to, for example, using the Seebeck effect to determine a temperature of, or a temperature differential across, a portion of a TE device.

SUMMARY OF THE DISCLOSURE

According to some embodiments, a thermoelectric system comprises a thermoelectric device having a first surface and a second surface and a power source configured to deliver a voltage across the thermoelectric device to selectively activate or deactivate the thermoelectric device. In some embodiments, the first surface is configured to heat and the second surface is configured to cool when the thermoelectric device is electrically activated. The system further comprises a processor configured to determine a potential between the first surface and the second surface when the thermoelectric device is deactivated (e.g., where no or substantially no electrical voltage is delivered to it), correlate the potential to a temperature of the first surface and adjust the correlated temperature of the first surface based on an ambient temperature.

According to some embodiments, the processor is further configured to compare the temperature of the first surface with a desired temperature and adjust the amount of power supplied to the thermoelectric device by the power supply, thereby reducing an amount of error between the temperature of the first surface and the desired temperature. In some embodiments, the system further comprises a second thermoelectric device. In some embodiments, the processor is further configured to determine a potential between the first and second surfaces of the second thermoelectric device when the second thermoelectric device is deactivated, correlate the potential between the first and second surfaces of the second thermoelectric device to a temperature of the first surface of the second thermoelectric device, compare the temperature of the first surface of the second thermoelectric device with the temperature of the first surface of the first thermoelectric device and adjust an output to at least one of the first and second thermoelectric devices based on the comparison.

According to some embodiments, the thermoelectric device is located in a seat (e.g., car or other vehicle seat, task or desk chair, etc.). In some embodiments, the thermoelectric device is located in a cup holder, cool bin or other cooling storage container or slot (e.g., phone or other electronic device cooling system). In some embodiments, the thermoelectric device is located in a bed system (e.g., consumer bed, medical or hospital bed, medical topper, etc.). In other embodiments, the thermoelectric device is located in a medical application (e.g., medical bed, patient cooling, wheelchair, etc.). In some embodiments, the thermoelectric device is located in a battery thermal management application or system. In some embodiments, the system is configured to provide temperature controlled fluid to a vehicle battery.

According to some embodiments, a method of controlling a duty cycle or a power level of a thermoelectric device comprises determining a potential between a first surface of a thermoelectric device and a second surface of the thermoelectric device when the thermoelectric device is electrically deactivated or depowered, wherein the first surface is configured to heat and the second surface is configured to cool when the thermoelectric device is electrically activated or powered. The method further comprises correlating the potential with a temperature of the first surface of the thermoelectric device and adjusting the duty cycle or the power level of the thermoelectric device based on a comparison of the temperature of the first surface of the thermoelectric device with a desired temperature.

According to some embodiments, a method of measuring a temperature of a side of a thermoelectric device having a first side and a second side comprises providing the thermoelectric device, the thermoelectric device configured to be selectively electrically activated or deactivated and measuring a voltage potential between the first side and the second side when the thermoelectric device is deactivated. The method further includes correlating the voltage potential to a temperature of at least one side of the thermoelectric device. In some embodiments, correlating the voltage potential to the temperature of the at least one side is accomplished using a lookup table or calculation (e.g., via a database, computer, network, mainframe, etc.).

According to some embodiments, a method of providing temperature control to a system, the method comprises providing a thermoelectric device, the thermoelectric device comprising a first surface and a second surface, said thermoelectric device being configured to be selectively activated or deactivated, wherein the thermoelectric device is configured to receive power from a power source when it is activated. The method further includes determining a potential between the first surface and the second surface when the thermoelectric device is deactivated, correlating the potential with a temperature of the first side, comparing the temperature of the first side with a desired temperature value and adjusting the power received by the thermoelectric device based on the comparison, thereby changing an amount of heat exchanged between a fluid and at least one of the first surface and the second surface, wherein the fluid is provided to the system.

According to some embodiments, the system comprises a vehicle seat (e.g., automobile seat) or another type of seating assembly (e.g., sofa, task, desk or office chair, etc.). According to some embodiments, the system comprises a cup holder, cool bin or other storage compartment or device. In some embodiments, the system comprises a medical application (e.g., wheelchair, medical bed or topper, medical cooling apparatus, etc.). In some embodiments, the system comprises a bed system. In one embodiment, the system comprises a cooling tower or other cooling device or system. In some embodiments, the system comprises thermal management. In some embodiments, the system comprises a thermoelectric generator.

In some embodiments, a TE system includes a TE device having a first surface and a second surface, a power source configured to power and depower the TE device, and a processor. The processor can be configured to determine a potential between the first surface and the second surface when the TE device is depowered. The processor can also be configured to correlate the potential to a temperature of the first surface. In certain instances, the processor is further configured to adjust the correlated temperature of the first surface based on an ambient temperature. The processor can be configured to compare the temperature of the first surface with a desired temperature and to adjust an output to the TE device.

In certain embodiments, the system includes a second TE device. In some embodiments, the processor is configured to determine a potential between the first and second surfaces of the second TE device when the second TE device is depowered. The processor can also be configured to correlate the potential between the first and second surfaces of the second TE device to a temperature of the first surface of the second TE device. The processor can be configured to compare the temperature of the first surface of the second TE device with the temperature of the first surface of the first TE device. In some such instances, the processor is configured to adjust an output to at least one of the first and second thermoelectric devices based on the comparison.

Various applications for the TE device are contemplated. For example, the TE device can be used in a bed (e.g., a medical bed), seat (e.g., an automobile seat), cup holder, cooling tower, spacecraft, or airplane. In some embodiments, the system is configured to provide temperature controlled fluid to a vehicle battery. For example, the TE device can be at least partly located in a fluid duct of a temperature control and/or ventilation system for a vehicle battery.

In certain embodiments, a method of controlling a TE device that is cycled between powered and depowered modes includes determining a potential between a first surface of the TE device and a second surface of the TE device when the TE device is depowered. The method can also include correlating the potential with a temperature of the first surface. Further, the method can include adjusting an output to the TE device based on a comparison of the temperature of the first surface of the TE device with a desired temperature.

In some embodiments, a method of measuring a temperature of at least one side of a thermoelectric device (having a first side and a second side) includes providing the thermoelectric device. The thermoelectric device can be configured to receive power from a power source during certain time periods and to not receive power from the power source during other time periods. In some embodiments, the method also includes measuring a voltage potential between the first side and the second side when the thermoelectric device is not receiving power from the power source. The method can include correlating the voltage potential to a temperature of at least one side of the thermoelectric device. In certain embodiments, correlating the voltage potential to the temperature of the at least one side is accomplished using a lookup table.

In some embodiments, a method of providing temperature control to a system includes providing a thermoelectric device. In some embodiments, the thermoelectric device includes a first surface and a second surface and has an activated mode and a deactivated mode. The thermoelectric device can be configured to receive power from a power source. In certain embodiments, the method also includes determining a potential between the first surface and the second surface when the thermoelectric device is in the deactivated mode (e.g., off or other state where no or substantially no electrical voltage is supplied to the device, at an electrical activation level or voltage that is lower than the activation or first level, etc.). Some embodiments of the method include correlating the potential with a temperature of the first side and comparing the temperature of the first side with a desired temperature value. In certain embodiments, the method includes adjusting the power received by the thermoelectric device based on the comparison, thereby changing an amount of heat exchanged between a fluid and at least one of the first surface and the second surface, wherein the fluid is provided to the system. For example, the fluid can be air in a ventilation duct. In some embodiments, the system is a vehicle seat, a cup holder, or a wheelchair. In some embodiments, the system is hospital bed or a bed topper member. In certain arrangements, the system is a battery. In other arrangements, the system is a cooling tower.

BRIEF DESCRIPTION OF THE DRAWINGS

Various embodiments are depicted in the accompanying drawings for illustrative purposes, and should in no way be interpreted as limiting the scope of the embodiments. In addition, various features of different disclosed embodiments can be combined to form additional embodiments, which are part of this disclosure.

FIG. 9 illustrates a schematic view of a TE system according to an embodiment.

FIG. 10 illustrates a schematic view of a TE system according to an embodiment.

FIG. 11 illustrates a schematic view of a TE system according to an embodiment.

DETAILED DESCRIPTION OF SOME EMBODIMENTS

A variety of examples of TE systems and control methods therefore are described below to illustrate various examples that may be employed to achieve the desired improvements. These example embodiments are only illustrative and not intended in any way to restrict the general inventions presented and the various aspects and features of these inventions. For example, although certain embodiments and examples are provided herein in the automotive, medical, food service, aerospace, evaporative cooling, and other fields, the inventions are not confined or in any way limited or restricted to such fields and certain embodiments can be used in other fields. As discussed in greater detail herein, the various temperature detection and/or control schemes or methods discussed herein provide one or more benefits, such as, for example, enabling a system to respond more reliably and quickly, improving the reliability of a system (e.g., less failure modes or incidents) and/or the like. Furthermore, the phraseology and terminology used herein is for the purpose of description and should not be regarded as limiting. No features, structure, or step disclosed herein is essential or indispensible.

Figure 1:
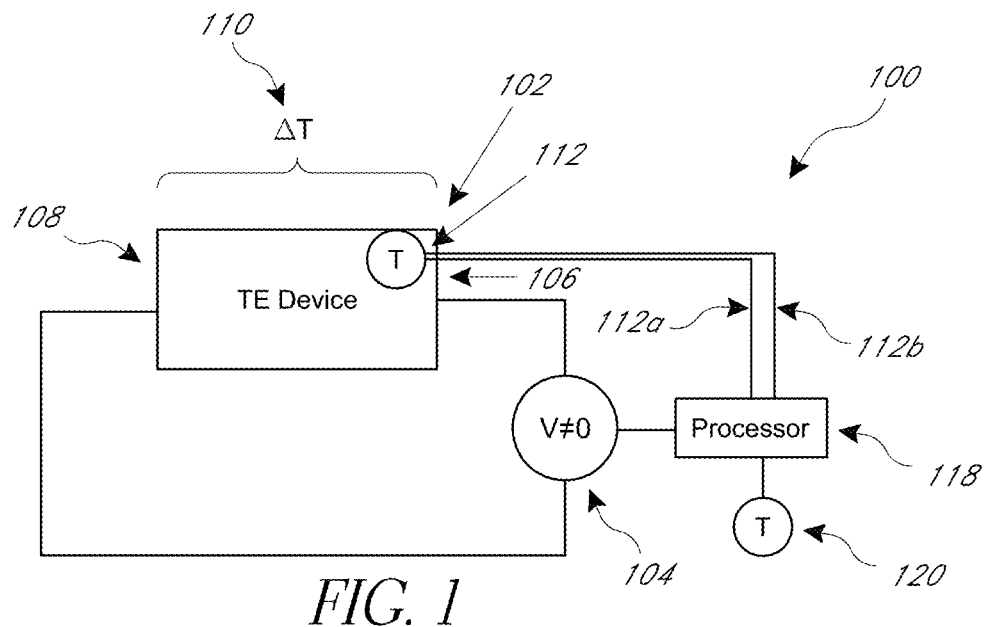
FIG. 1 illustrates an embodiment of a TE system in a powered mode, the system including a temperature sensor associated with a TE device.

As illustrated in FIG. 1, a TE system 100 can include a TE device 102, which in turn comprises a first side 106 and a second side 108. The TE device 102 can be operably coupled with a power source 104. The power source 104 can be configured to apply a voltage to the TE device 102. When the voltage is applied to the TE device 102, one side (e.g., the first side 106) creates heat while the other side (e.g., the second side 108) absorbs heat. Switching polarity of the circuit typically creates the opposite effect. In a typical arrangement, the TE device 102 comprises a closed circuit that includes dissimilar materials. As a DC voltage is applied to the closed circuit, a temperature difference 110 is produced at the junction of the dissimilar materials. Depending on the direction of the electrical current, heat is either emitted or absorbed at a particular junction. In some embodiments, the TE device 102 includes several solid state P and N type semi-conductor elements connected in series. In certain embodiments, the junctions are sandwiched between two electrical isolation members (e.g., ceramic plates), which can form the cold side and the hot side of the TE device 102. The cold side can be thermally coupled to an object to be cooled and the hot side can be thermally coupled to a heat sink which dissipates heat to the environment. In some such embodiments, a fluid in a fluid conduit (e.g., air in a duct) is passed over or near one of the sides 106, 108 in order to adjust the temperature of the fluid, which can then be delivered to a desired location (e.g., a seat, bed, cup holder or climate controlled compartment, cooling tower, battery, or otherwise) to provide temperature control thereof. Further details and examples of some embodiments of thermoelectric devices are provided in U.S. Patent Application Publication No. 2008/0047598, filed Aug. 3, 2007, titled "THERMOELECTRIC DEVICE," the entirety of which is incorporated herein by reference.

To facilitate such temperature control, it can be helpful to determine the ambient temperature, the temperature of at least one of the sides 106, 108 and/or a temperature within the TE device 102. Thus, some embodiments of the system 100 include: an ambient temperature sensor 120 and/or a TE device temperature sensor 112 (such as a thermistor). The TE device temperature sensor 112 can be located inside, adjacent to, near, or otherwise in close proximity to the TE device 102. Wires 112a, 112b and/or other electrically conductive connectors (e.g., electrical traces, busses, etc.) can electrically connect the temperature sensor 112 to other electrical components, such as a processor 118.

However, embodiments including one or more TE device temperature sensors 112 can be less desirable due to, for example, the cost of the sensor 112, the additional manufacturing steps and complexity associated with positioning the sensor 112 in the system 100, the possibility of sensor failure, and/or one or more other reasons or considerations. Furthermore, wires 112a, 112b or other electrical connectors can add manufacturing steps, such as connecting the wires to the sensor 112, routing the wires 112a, 112b through the TE device 102, routing the wires 112a, 112b to the processor 118, and connecting the wires 112a, 112b to the processor 118. Moreover, the temperature sensor 112 and the wires 112a, 112b are points of potential failure and thus can reduce the overall reliability of the system 100.

Figure 2A:
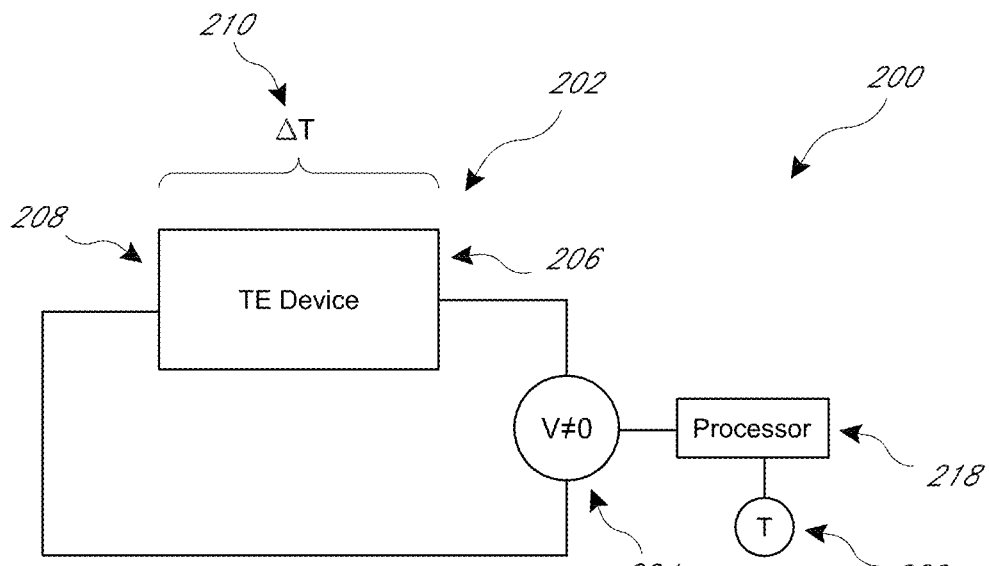
FIG. 2A illustrates another embodiment of a TE system in a powered mode, the system not including a temperature sensor associated with a TE device.

With regard to FIG. 2A, another embodiment of a TE system 200 is illustrated. The system 200 resembles or is identical to the system 100 discussed above in many respects, with some of the differences discussed below. Accordingly, numerals used to identify features of the system 200 are incremented by a factor of one hundred to identify like features of the system 200. This numbering convention generally applies to the remainder of the figures. Any component or step disclosed in any embodiment in this specification can be used in other embodiments.

Like the system 100, the system 200 can include a power source 204 operably coupled with a TE device 202 having first and second sides 206, 208. However, unlike the system 100, the system 200 does not employ a temperature sensor (see 112 in FIG. 1) to determine the temperature of one of the sides 206, 208. Rather, as discussed in greater detail below, the system 200 is configured to determine the temperature of one of the first and second sides 206, 208 (or a temperature differential across the TE device 202) by the potential induced by the Seebeck effect.

Figure 2B:
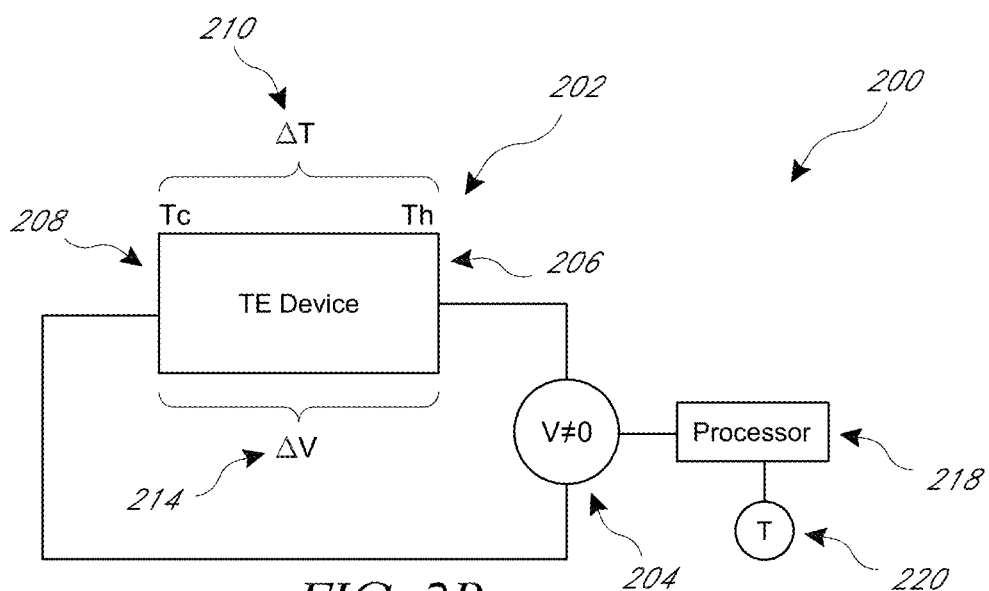
FIG. 2B illustrates the TE system of FIG. 2A in a depowered mode.

As shown in FIG. 2B, in certain embodiments, the power source can be turned off (e.g., supply zero volts to the TE device 202). In such instances, a temperature difference 210 between the first and second sides 206, 208 can induce a potential 214 between the first and second sides 206, 208. The inducement of the potential 214 is known as the Seebeck effect. The potential 214 produced is generally proportional to the temperature difference 210 between the first and second sides 206, 208 and can be expressed by the following equation:

$$V = \alpha(Th - Tc) = \alpha \Delta T$$

Where V is the potential 214 between the first and second sides 206, 208, $\alpha$ is the Seebeck coefficient, and (Th−Tc) or $\Delta T$ is the temperature difference 210 between the first and second sides 206, 208. As such, the Seebeck coefficient for a given TE device 202 can be described as the ratio of the potential 214 to the temperature difference 210 between the first and second sides 206, 208.

In some embodiments, the Seebeck coefficient $\alpha$ can be determined experimentally. For example, various voltages can be supplied to the TE device 202 (e.g., by the power source 204), and the resultant temperature difference 210 and corresponding potential 214 can be observed. For example, a 9-volt power source 204 can be applied to the TE device 202. Then the power source 204 can be disconnected, and the temperature difference 210 and potential 214 can be measured. A similar procedure can be applied for various other voltages, such as 12-volt, 15-volt, 24-volt, and otherwise. From these empirical readings of temperature difference 210 and potential 214, the Seebeck coefficient $\alpha$ can be determined for a given TE system 200.

In certain configurations, for a TE system 200 with a known Seebeck coefficient $\alpha$, the temperature difference 210 between the first and second sides 206, 208 can be determined based on the voltage potential 214. For example, in some cases, the temperature difference 210 ($\Delta T$) is approximately equal to the potential 214 divided by the Seebeck coefficient $\alpha$. Such a configuration can, for example, provide for monitoring of the temperature difference 210 of the TE device 202 without the need for a separate temperature sensor. As noted above, the elimination of such a temperature sensor can facilitate manufacturing (e.g., reduce process steps), decrease manufacturing time, reduce costs, increase device longevity, and/or provide one or more other advantages or benefits. Further, not including of such a sensor can simplify the design of the TE device 202, for example, by eliminating channels through the TE device 202 for the passage of wires for the sensor. Furthermore, not including such a sensor can improve reliability of the system 200 by reducing the total number of components that could fail.

Various embodiments of the system 200 are configured to determine an absolute temperature of at least one of the sides 206, 208 of the TE device 202, as will be discussed further below. In some embodiments, the temperature difference 210 and/or the absolute temperature of at least one of the sides 206, 208 is used in a feedback control scheme, which can, for example, provide for a faster response time and/or reduced thermal lag for temperature feedback compared to systems employing a separate temperature sensor (e.g., the sensor 112 in the system 100). Additional details regarding illustrative embodiments of such a feedback control scheme are provided below. In some embodiments, the temperature difference 210 and/or the absolute temperature of at least one of the sides 206, 208 is used for fault monitoring. For example, the temperature difference 210 and/or the absolute temperature of at least one of the sides 206, 208 can be used to detect overheating of the TE device 202, which could reduce the efficiency of the TE device 202 or otherwise damage the device and/or other components of the TE system 200.

The TE system 200 can be used in most any application in which thermoelectric closed loop control would be advantageous. For example, the TE system 200 can be used in any type of support assembly 205 such as heated and/or cooled beds, hospital beds, bed topper members, vehicle seats, wheelchairs and/or any other seating assemblies as shown schematically in FIG. 9. In other embodiments, the TE system 200 is used in cooling towers or other industrial applications where temperature control is desired. In yet other embodiments, the TE system 200 is used in cup holders or other small or large climate controlled compartments or devices 206 as shown schematically in FIG. 10. For example, the TE system 200 can be used in food and/or beverage containers (e.g., coolers), wine racks, shipping containers, animal crates, and otherwise. In still further embodiments, the TE system 200 is used in battery cooling systems 207 as shown schematically in FIG. 11, such as for electric vehicles, hybrid vehicles, and/or the like. In other embodiments, the TE system 200 is used in an aircraft or a spacecraft, such as a satellite, capsule, orbiting telescope, or otherwise. Of course, the above-listed applications are illustrative only and are not intended to be limiting. Indeed, the TE system 200 is contemplated for use in most any application in which temperature control with a TE device would be beneficial.

Figure 2C:
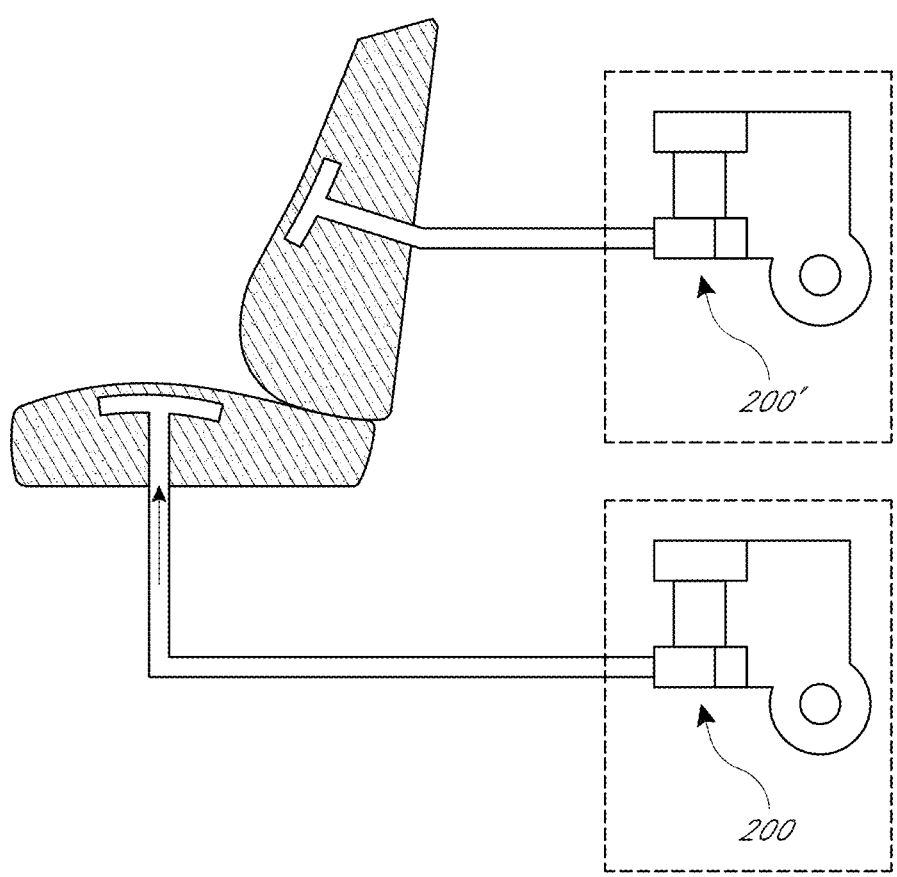
FIG. 2C illustrates a vehicle seat as an example of use of the TE system of FIG. 2A.

As noted above, in some embodiments, the TE system 200 is used in a seat for an automobile or other vehicle. For example, the TE system 200 or portions thereof, can be located in a heated and/or cooled automobile seat system. In certain embodiments, such as in the embodiment shown in FIG. 2C, multiple TE systems 200 can be provided to the seat. For example, a first TE system 200 can provided to a seat cushion and a second TE system 200' can be provided to a seatback. In some arrangements, the TE systems 200, 200' are part of a temperature control system, which can include things such as fans and ducts.

In some embodiments of the TE system 200 in an automobile or other vehicle, the automobile or other vehicle includes an ambient temperature sensor, the data from which is broadcast on a communication bus. In some cases, the processor 218 is in communication with the communication bus and thus able to receive the ambient temperature sensor signal. Thus, in such embodiments, an additional ambient temperature sensor specific to the TE system 200 is not needed.

Figure 3:
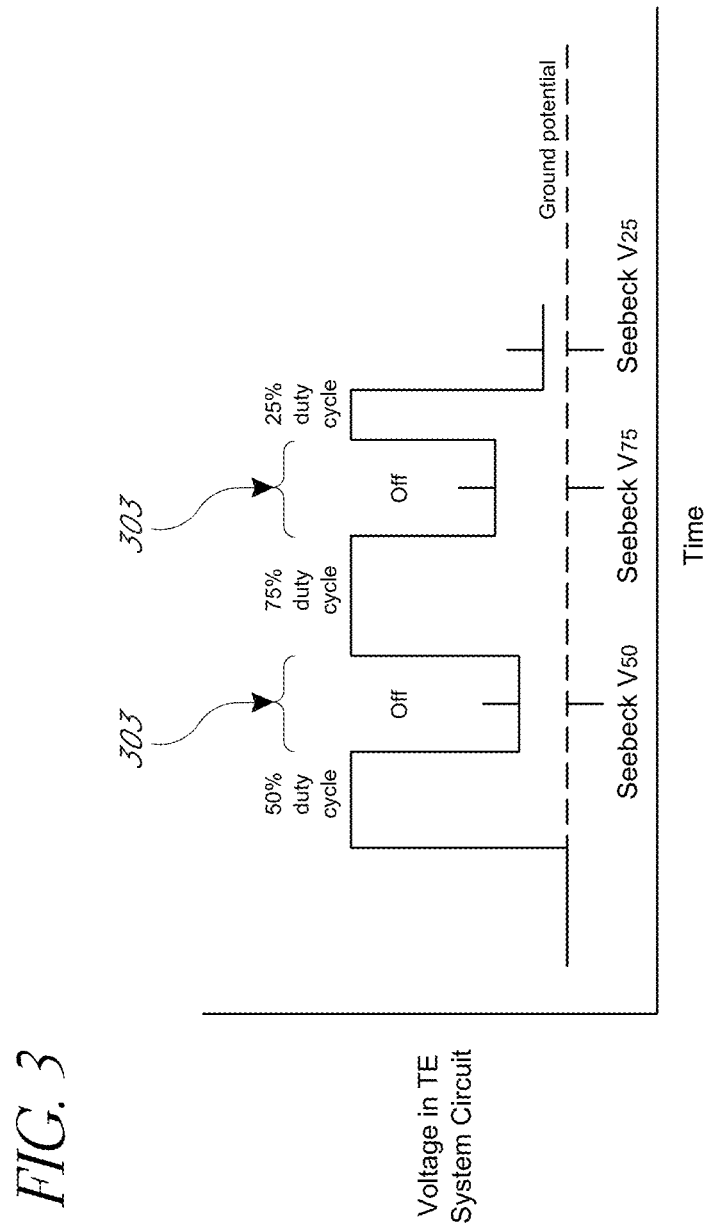
FIG. 3 illustrates a chart of an example of voltage applied to a TE device as a function of time.

As shown in FIG. 3, the TE device 202 can be powered (e.g., when the power source 204 is energized and is applying a certain voltage to the TE device 202) for certain periods of time and depowered or deactivated (e.g., when the power source 204 is applying about zero volts to the TE device 202) for certain periods of time. As indicated in FIG. 3, in some embodiments, the potential 214 is generally measured during one or more time periods 303, which can occur when the TE device 202 is in the depowered or deactivated mode.

In certain embodiments, the ratio of the amount of time that the TE device 202 is in the powered mode to the total amount of time under consideration is known as the "duty cycle." Duty cycle is generally expressed as a percentage. For example, if the TE device 202 was powered for three seconds within a ten second time period, then the duty cycle would be expressed as 30%. In certain embodiments, such as is shown in FIG. 3, the potential 214 (the Seebeck voltage) can be affected by the duty cycle. For example, in certain arrangements, an increase in the duty cycle results in an increase in the potential 214. This is because, by way of example, an increase in the duty cycle generally results in an increase in the amount of power supplied to the TE device, which in turn can result in a greater Seebeck potential when the power supply is discontinued.

In some embodiments, the TE device 202 is activated and deactivated several times each second. According to some embodiments, for example, the TE system 200 may operate at approximately 200 Hz. In some embodiments, the TE system 200 operates in the range of approximately 60 Hz to approximately 300 Hz. In some embodiments, the TE system 200 operates at approximately 10, 20, 30, 60, 100, 120, and/or 150 Hz. Other embodiments operate at various other frequencies.

In some embodiments, the TE device 202 is powered via pulse-width modulation (PWM). In some implementations, the processor 218 controls the amount of power applied to the TE device 202 by adjusting (e.g., by software) the length of time that the power source 204 supplies power to the TE device 202. For example, as shown in FIG. 3, for a 50% duty cycle, voltage from the power source 204 can be applied to the TE device 202 for about twice as long as for a 25% duty cycle. Likewise, during a 75% duty cycle, voltage can be applied to the TE device 202 about three times longer than during a 25% duty cycle. Using PWM, the energized and de-energized cycles (which together form a square wave) of the TE device 202 can be modulated to achieve a desired analog signal level e.g., a temperature setpoint. In other words, in some embodiments, power is supplied to the TE device 202 by way of a plurality of "on" and "off" pulses of the power source 204 (whereby the "on" time is the time during which the power is supplied, and the "off" time is the period during which the power is switched off) in order to achieve a desired output. Such a configuration can, for example, reduce the total amount of power supplied to the TE device 202, while not appreciably affecting or interrupting the operation of the TE device 202. For example, in some arrangements, any negative effects or disruptions to the TE device can be reduced or minimized when the switching frequency of the "on" and "off" pulses is faster than the response time of the TE device 202 to a change in the power state.

Further, given that the TE device 202 is depowered or deactivated for certain time periods during PWM, the potential 214 of the TE device 202 can be measured during such periods without interrupting the normal operation of the TE device 202. However, in other embodiments, operation of the TE device 202 is temporarily interrupted (e.g., depowered) for a short period of time, such as for a period of a few microseconds. In such embodiments, the interruption is generally so brief as to not inhibit controlling the TE device 202 to maintain a desired output, such as a desired temperature.

In some embodiments, the processor 218 can be in communication with an ambient temperature sensor 220 and can be configured to determine the potential 214. For example, an analog input of the processor 218 can be in communication with a negative temperature coefficient device or other device, from which a signal can be used to determine (e.g., by a calculation) an ambient temperature. Such a configuration can, for example, allow for the determination of an absolute temperature of at least one of the first and second sides 206, 208 of the TE device 202. For example, the absolute temperature can be determined with a calculation or by correlating the potential 214 with a known (e.g., by empirical measurements) absolute temperature for at least one of the first and second sides 206, 208. For instance, the correlation may be performed with a lookup table, as discussed in further detail below. The calculated or correlated absolute temperature can then be adjusted based on the ambient temperature. In some instances, the absolute temperature of one of the first and second sides 206, 208 is determined by adding the temperature difference 210 and the ambient temperature. In certain scenarios, the absolute temperature of one of the first and second sides 206, 208 is used in a closed loop feedback control scheme, which can, in some embodiments, enhance the response time of the control scheme.

In certain embodiments, the determination of the absolute temperature of at least one of the first and second sides 206, 208 includes other factors as well. For example, the voltage of the voltage source 204 (e.g., a battery) and/or the duty cycle that was applied to the TE device 202 that resulted in the temperature difference 210 can be used in determining the absolute temperature of at least one of the first and second sides 206, 208. Generally, such factors are dependent on the characteristics of a particular TE device design and are determined empirically. In some embodiments, the status of other components (e.g., fan speed) is also used in determining the absolute temperature.

In some instances, the relationship between the absolute temperature of at least one of the sides 206, 208 and the potential 214 is determined by a computation, which can be programmed in the processor 218. In other instances, the relationship between the absolute temperature of at least one of the sides 206, 208 and the potential 214 is set forth in a lookup table, which can be programmed in the processor 218 or reside in a data storage element, such as a magnetic disk or other memory element. In certain arrangements, employing a lookup table can, for example, provide a faster response than embodiments employing a computation.

Figure 4:
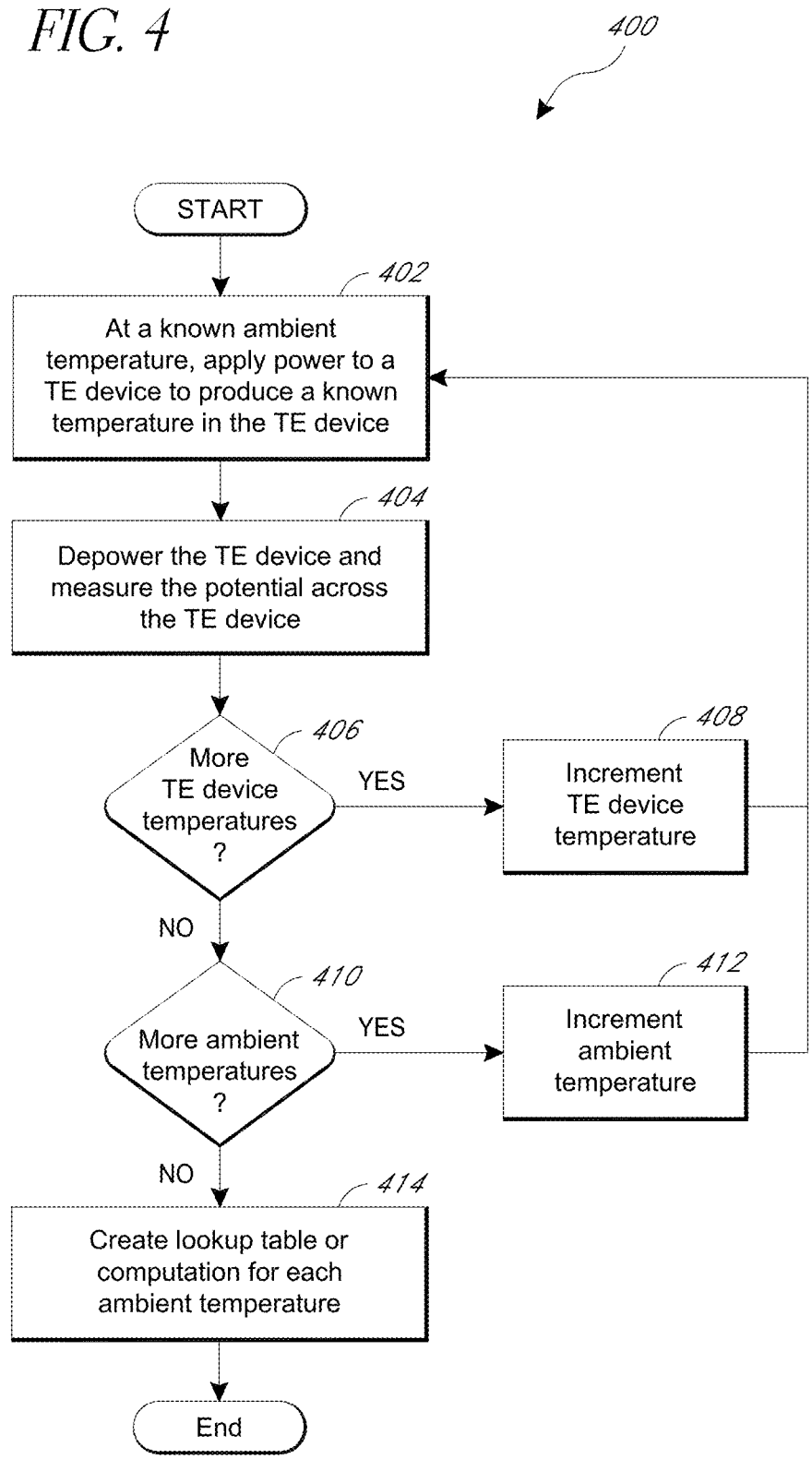
FIG. 4 illustrates an embodiment of a method of producing a lookup table of temperatures of a surface of a TE device and corresponding Seebeck potentials.

An embodiment of a method 400 of producing such a lookup table or computation is illustrated in FIG. 4. In block 402, at a known ambient temperature, power is applied to a TE device to produce a desired temperature difference (e.g., between the first and second sides) in the TE device. For example, in some embodiments, at an ambient temperature of about 0° C., the TE device can be powered to produce a temperature difference of about 4° C. In other embodiments, power is applied to a TE device to produce a desired absolute temperature on a side of the TE device. For example, at an ambient temperature of about 0° C., sufficient power can be supplied to the TE device such that one side of the TE device has a temperature of about 4° C. During the method 400, the temperature difference and/or absolute temperature of the TE device can be monitored with, e.g., temporary sensors located on, near, or adjacent the first and/or second sides of the TE device.

In block 404, the TE device can be depowered or deactivated. For example, the power source can be disconnected from the TE device. Additionally, in block 404 the potential across the first and second sides can be measured. For example, in some embodiments, at the above-described ambient temperature of 0° C. and/or absolute temperature of about 4° C. on one side of the TE device, a potential of about 0.4 volts may be measured.

In block 406, a decision can be made whether there are additional temperatures (e.g., gradient or absolute) to be analyzed at the present ambient temperature. For example, if the TE device is intended to operate with a temperature of about 0° C. to about 50° C., block 406 asks whether additional data points between about 0° C. and about 50° C., as well as the corresponding potentials, are desired to be measured. If the answer is affirmative, the method 400 moves to block 408, where the TE device temperature is incremented (e.g., by 4° C.). The method then loops back to block 402, in which power is applied to the TE device to produce the incremented temperature in the TE device. In some embodiments, the loop from blocks 402, 404, 406, 408 and back to block 402 occurs at generally the same ambient temperature.

However, if the answer in block 406 is negative, then the method 400 moves to block 410, which queries whether there are additional ambient temperatures to be analyzed. For example, if the TE device is intended to be used in a range of ambient temperatures (e.g., −10° C. to 30° C.), block 410 asks whether the loop of blocks 402-408 should be completed for additional ambient temperatures within that range. If the answer in block 410 is affirmative, then the method 400 moves to block 412, in which the ambient temperature is incremented (e.g., by 5° C.). The method 400 then loops back to block 402, in which power is applied to the TE device to produce the temperature in the TE device at the incremented ambient temperature.

If, on the other hand, the answer to block 410 is negative, the method 400 moves to block 414, in which a computation is generated or a look-up table is created for each of the temperatures in the TE device 102 and at each of the ambient temperatures for which blocks 402-408 were completed. An example of a look-up table for three ambient temperatures (e.g., about 0° C., about 5° C., and about 10° C.) is shown in Table 1 below. The method 400 can then end.

TABLE 1

| Ambient = approx. 0 C. | | Ambient = approx. 5 C. | | Ambient = approx. 10 C. | |
| --- | --- | --- | --- | --- | --- |
| Temperature (° C.) | Potential (V) | Temperature (° C.) | Potential (V) | Temperature (° C.) | Potential (V) |
| 4.2 | 0.15 | 9.2 | 0.16 | 14.4 | 0.16 |
| 7.9 | 0.34 | 12.7 | 0.35 | 18 | 0.36 |
| 10.7 | 0.5 | 15.5 | 0.51 | 20.7 | 0.52 |
| 13.3 | 0.64 | 18.1 | 0.66 | 23.4 | 0.67 |
| 15.9 | 0.8 | 20.7 | 0.82 | 25.9 | 0.83 |
| 18.5 | 0.96 | 23.2 | 0.96 | 28.3 | 0.98 |
| 20.9 | 1.09 | 25.6 | 1.1 | 30.8 | 1.12 |
| 23.4 | 1.24 | 28.1 | 1.25 | 33.1 | 1.26 |
| 25.7 | 1.37 | 30.2 | 1.4 | 35.3 | 1.4 |
| 28 | 1.5 | 32.5 | 1.52 | 37.6 | 1.55 |
| 30.1 | 1.67 | 34.7 | 1.67 | 39.7 | 1.7 |
| 32.2 | 1.8 | 37.4 | 1.82 | 42.1 | 1.85 |
| 34.3 | 1.92 | 39.4 | 1.98 | 44.3 | 2 |
| 35.8 | 2.04 | 41.4 | 2.1 | 46.3 | 2.12 |
| 39.1 | 2.2 | 43.5 | 2.22 | 48.3 | 2.25 |
| 40.8 | 2.33 | 45.3 | 2.35 | 50.2 | 2.36 |

With reference to Table 1, at a given ambient temperature, a potential was provided to an embodiment of the TE device 102 to produce a measured temperature difference (e.g., when the TE device 102 was depowered). For example, at an ambient temperature of about 0° C., to produce a measured temperature difference of about 4.2° C., it was found that a supply of about 0.15 V was needed to the TE device 102. As another example, at an ambient temperature of about 0° C., it was determined that about 0.34 V was needed to be supplied to the TE device 102 to produce a measured temperature difference of about 7.9° C. This process continued for various other target temperatures (as shown above) until a target temperature of about 40.8° C. and the corresponding potential of about 2.33V were found.

The ambient temperature was then incremented to a new ambient temperature, such as about 5° C. As shown above, several target temperatures and corresponding potentials (when the TE device 102 was depowered) were then determined. For example, at an incremented ambient temperature of about 5° C. and for a target temperature was then set to about 9.2° C., the potential needed to be supplied to the TE device 102 was found to be about 0.16 V. The process continued through several other target temperatures and corresponding potentials for the 5° C. ambient temperature. The ambient temperature was then incremented to about 10 C and several target temperatures and corresponding potentials (e.g., when the TE device 102 was depowered) were then determined.

Figure 5:
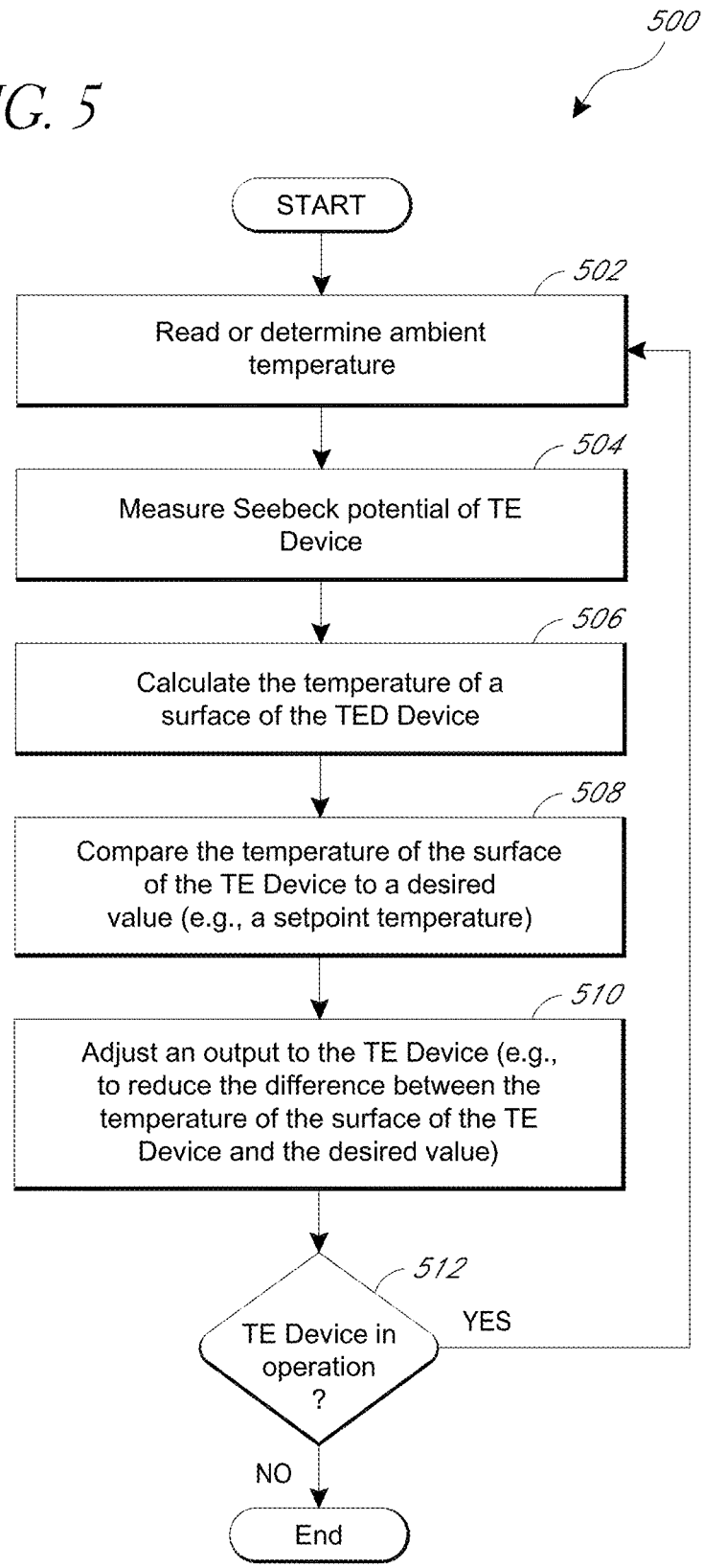
FIG. 5 illustrates an embodiment of a method of controlling a TE device based on the Seebeck potential of the TE device.

With regard to FIG. 5, an embodiment of a method 500 of controlling a TE device is illustrated. As shown in block 502, the ambient temperature is read or determined, e.g., with an ambient temperature sensor. In some embodiments, block 502 includes communicating with other components in related systems, e.g., over a communication bus in an automobile, in order to read or determine the ambient temperature.

The method 500 then moves to block 504, in which the Seebeck potential of the TE device is measured. For example, in some embodiments, the processor is configured to measure the potential of the TE device. In other embodiments, the processor is configured to communicate with another component that measures the potential of the TE device. Generally, the potential of the TE device is measured when the TE device is depowered.

In some embodiments, the method 500 further includes block 506, in which the absolute temperature of a surface of the TE device is calculated. This can include, for example, determining (e.g., with a computation or lookup table) the absolute temperature based on the Seebeck potential measured in block 504. In certain embodiments, block 506 also includes adjusting the absolute temperature determination with the ambient temperature from block 502. Further, in some arrangements, the absolute temperature determination includes other factors (e.g., duty cycle and battery voltage) as well. In some implementations, the Seebeck potential is measured during a duty cycle period in which the TE device 102 is de-energized.

In some embodiments, the method 500 includes block 508, in which the absolute temperature of a surface of the TE device is compared with a desired value for the TE device, such as a temperature setpoint to determine the amount of error. For example, the desired value can be provided to the processor (e.g., by a person adjusting a dial or other input device) and the processor can conduct the comparison.

In some embodiments, the method includes block 510, in which the signal to the TE device is modified to reduce the error between the absolute temperature of a surface of the TE device and the desired value for the TE device. For example, if the absolute temperature of a surface of the TE device is higher than the desired value for the TE device, future duty cycles for the TE device can be decreased (e.g., from 40% to 20%), thereby decreasing the absolute temperature of a surface of the TE device and reducing the error between the absolute temperature of a surface of the TE device and the desired value for the TE device. In some cases, the error is supplied to, for example, a PID controller.

As shown, block 512 can ask whether the TE device continues to be in operation. For example, for a TE device in an automobile seat cushion, the block 512 can ask whether the automobile key remains in the ignition and/or whether a seat occupancy sensor indicates that the seat is occupied. If the answer to block 512 is in the affirmative, then the method 500 can loop back to block 502 to begin again. If, however, the answer to block 512 is negative, then the method 500 ends.

The method 500 can, for example, increase responsiveness of a system compared to systems having an embedded temperature sensor 112 (see FIG. 1). For example, the method 500 systems can reduce thermal lag (e.g., the time between a temperature charge occurring and that temperature charge being detected) compared to systems employing a TE device temperature sensor. Furthermore, the method 500 eliminates the need for the TE device temperature sensor, thereby reducing components and manufacturing steps, as well as eliminating wiring to the TE device temperature sensor and associated wiring channels in a housing of the TE device.

Figure 6:
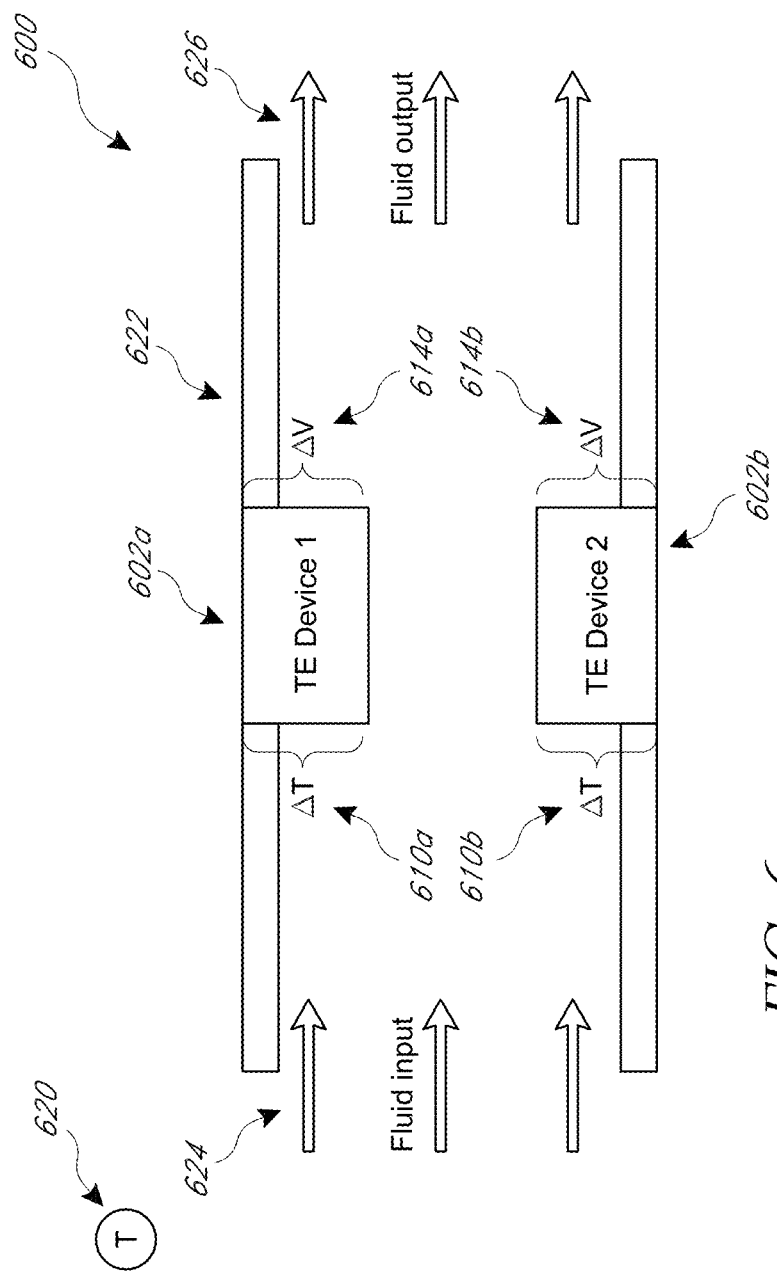
FIG. 6 illustrates an embodiment of a TE system in a fluid conduit, the TE system including a plurality of TE devices in parallel with respect to a flow of fluid through the conduit.

As illustrated in FIG. 6, in some embodiments, a TE system 600 can include a plurality of TE devices 602a, 602b. Although two TE devices 602a, 602b are shown, some embodiments of the system 600 include three, four, five, six, or more TE devices. The TE devices 602a, 602b can be similar to and similarly controlled as TE devices 202 discussed herein. For example, each of the TE devices 602a, 602b can be powered by a power source (not shown), which can selectively provide electrical power to each of the devices 602a, 602b. In certain embodiments, the TE devices 602a, 602b share a common power source. In other arrangements, the TE devices 602a, 602b each has a dedicated power source.

As discussed in greater detail above, when power is applied to the TE devices 602a, 602b, temperature differences in the TE devices 602a, 602b can result. For example, the TE device 602a can have a temperature difference 610a and the TE device 602b can have a temperature difference 610b. Furthermore, when the TE devices 602a, 602b, are depowered, in some instances, the Seebeck effect can induce potentials in the TE devices 602a, 602b. For example, the TE device 602a can have a potential 614a and the TE device 602b can have a potential 614b.

The TE devices 602a, 602b can be located at least partly in a fluid conduit 622. For example, in the embodiment illustrated, the TE devices 602a, 602b are located partly in a duct, such as an air duct in a temperature control system. Fluid, such as ambient air, can enter the conduit 622 at a first end 624 and can exit the conduit 622 at a second end 626. Between the first and second ends 624, 626, the fluid can pass through, over, and/or near one or more of the TE devices 602a, 602b. Thus, in certain embodiments, due at least partly to the temperature differences 610a, 610b of the TE devices 602a, 602b, heat transfer between the fluid and the TE devices 602a, 602b can occur, thereby changing the temperature of the fluid as it passes through the conduit 622. For example, the duty cycle and/or potentials 614a, 614b and or temperature differences 610a, 610b can be controlled so as to transfer. Sufficient heat to the fluid to maintain a desired fluid temperature downstream of the TE devices 602a, 602b. As shown, in some embodiments, the TE devices 602a, 602b are arranged in parallel with respect to the fluid flowing through the conduit 622.

In certain embodiments, the system 600 is configured to determine an ambient temperature. For example, in some instances, the system 600 includes an ambient temperature sensor 620. In other instances, the system 600 is configured to receive the ambient temperature from another system, such as from a communication bus in an automobile.

As previously discussed, the TE devices 602a, 602b can be controlled based on, for example, the potential 614a, 614b and the ambient temperature. In some embodiments, the same ambient temperature is used to control each of the TE devices 602a, 602b. Such configurations can, for example, reduce the total number of components of the system 600, thus reducing cost, complexity, and potential for failure. For example, a single ambient temperature sensor 620 can be used rather than a dedicated ambient temperature sensor for each of the TE devices.

Figure 7:
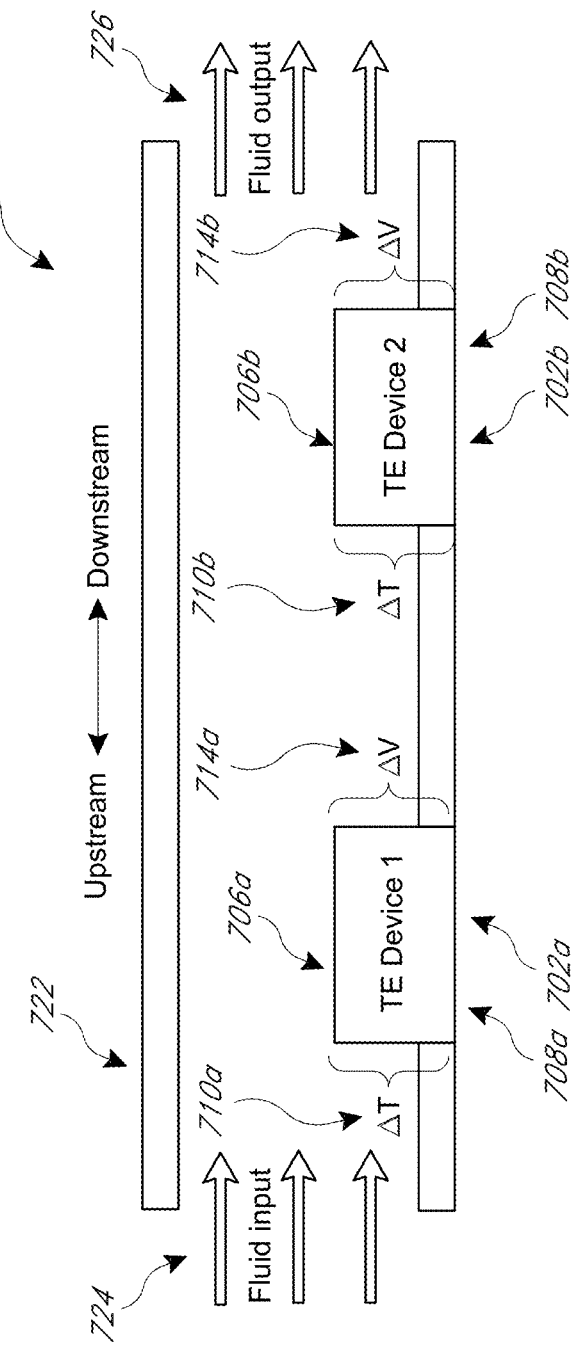
FIG. 7 illustrates an embodiment of a TE system in a fluid conduit, the TE system including a plurality of TE devices in series with respect to a flow of fluid through the conduit.

With regard to FIG. 7, another embodiment of a TE system 700 having a plurality of TE devices, 702a, 702b is illustrated. Such an embodiment may, for example, be used in a climate controlled bed or other seating assembly. For instance, one of the TE devices 702a, 702b could be located at the foot of the bed and the other of the TE devices 702a, 702b could be located at the head of the bed. As shown, the TE devices 702a, 702b can be located in a fluid conduit 722, such as a duct. Fluid, such as ambient air, can enter the conduit 722 from a first end 724 and traverse through the conduit to a second end 726. In certain embodiments, the fluid can pass through, over, and/or near the TE devices 702a, 702b. Furthermore, like in some of the systems discussed above, the system 700 can be configured to determine an ambient temperature, such as via an ambient temperature sensor (not shown).

In accordance with certain other embodiments discussed herein, when power is applied to the TE devices 702a, 702b from a power source (not shown), a temperature differential can results across the TE devices 702a, 702b. For example, the TE device 702a can have a temperature difference 710a between a first side 706a and a second side 708a, and the TE device 702b can have a temperature difference 710b between a first side 706b and a second side 708b. Moreover, when power is discontinued to the TE devices 702a, 702b, in some embodiments, the Seebeck effect induces potentials in the TE devices 702a, 702b. For example, the TE device 702a can have a potential 714a and the TE device 702b can have a potential 714b.

In certain embodiments, such as in the embodiment depicted in FIG. 7, the TE devices 702a, 702b are positioned in series with regard to the fluid flowing through the conduit 722. In some such embodiments, the fluid encounters TE device 702a then TE device 702b.

In certain embodiments, due to, for example, the temperature difference 710a of the TE device 702a, the temperature of the fluid is changed as it passes through, over, and/or near the TE device 702a. In some such instances, the temperature of the fluid downstream of the TE device 702a and upstream of the TE device 702b is approximately the sum of the ambient temperature and the absolute temperature of the first side 706a of the TE device 702a. Thus, in such cases, the temperature of the fluid that encounters the TE device 702b has been changed by the TE device 702a.

In some embodiments, due to, for example, the temperature difference 710b of the TE device 702b, the temperature of the fluid is changed as it passes through, over, and/or near the TE device 702b. In some such instances, the temperature of the fluid downstream of the TE device 702b is the approximately the sum of the temperature of the fluid that is downstream of the TE device 702a and upstream of the TE device 702b plus the absolute temperature of the first side 706b of the TE device 702b. In certain instances, the temperature of the fluid downstream of the TE device 702b is the approximately the sum of the ambient temperature, the absolute temperature of the first side 706a of the TE device 702a, and the absolute temperature of the first side 706b of the TE device 702b.

In certain embodiments, the TE devices 702a, 702b can operate in conjunction to provide a desired temperature of fluid. For example, the TE devices 702a can raise the temperature of the fluid a first amount and the second TE device 702b can raise the temperature of the fluid a second amount. Likewise, the TE devices 702a can lower the temperature of the fluid a first amount and the second TE device 702b can lower the temperature of the fluid a second amount. In further embodiments, for example in instances in which dehumidified and temperature controlled fluid is desired, the TE device 702a can lower the temperature of the fluid an amount (e.g., so as to promote water vapor in the fluid to condense), then TE device 702b can raise the temperature of the fluid to approximately a desired temperature level (e.g., a user-selectable temperature setpoint).

Figure 8:
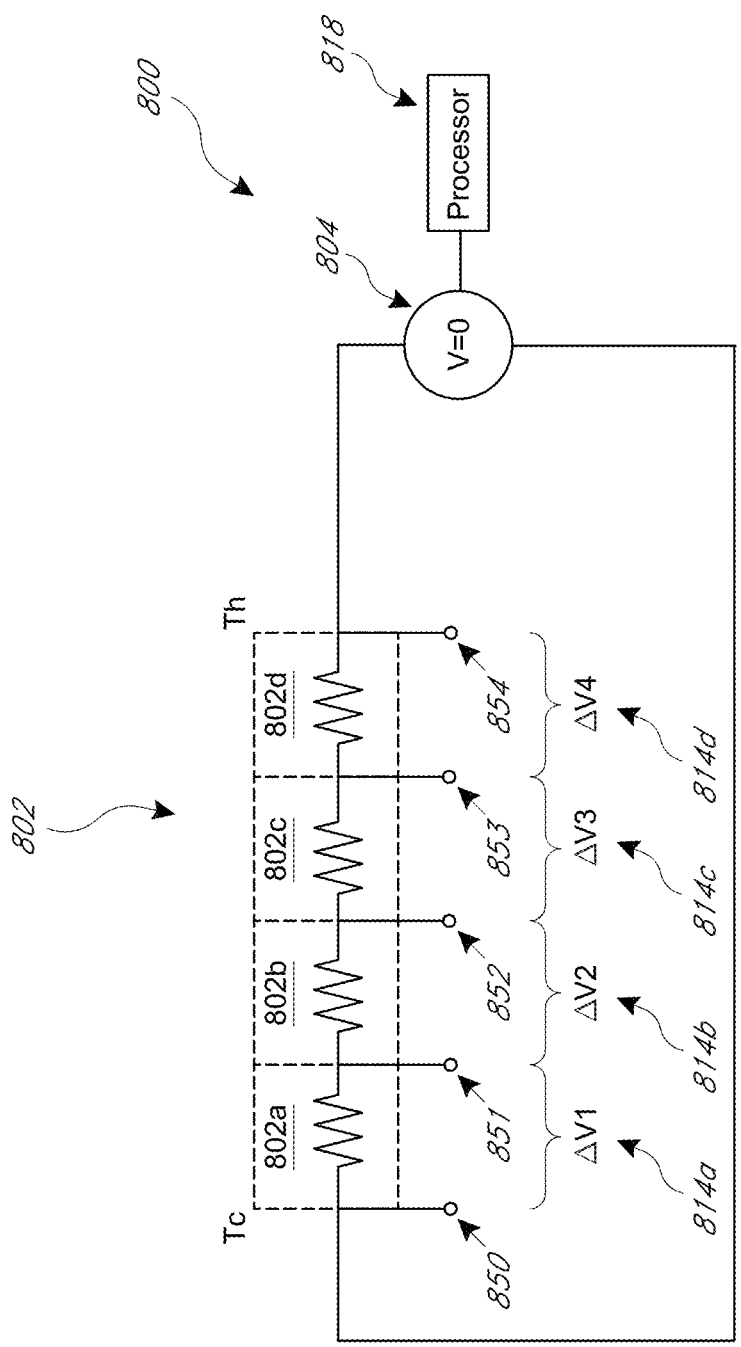
FIG. 8 illustrates an embodiment of a TE system having a TE device with multiple zones.

With reference to FIG. 8, another embodiment of a TE system 800 is illustrated. As shown, the TE system 800 includes a TE device 802, which includes a plurality of zones 802a-d. Of course, the TE device 802 can include more or fewer zones than the four zones illustrated, such as two, three, five, six, or otherwise. In some embodiments, the TE device 802 also include one or more electrical connections 850-854, which can be in electrical communication with, for example, a processor 818. The processor 818 can be configured to measure or otherwise determine a potential 814a-d for each of the zones 802a-d based on the connections 850-854. For example, the potential 814a for zone 802a can be determined by measuring the potential between the connections 850 and 851; the potential 814b for zone 802b can be determined by measuring the potential between the connections 851 and 852; and so on. Such a configuration can, for example, facilitate the monitoring and/or comparison of the potentials 814a-d, and thus the respective temperature of, each of the zones 802a-d of the TE device 802. Such monitoring and/or comparison can be used to detect, for example, a malfunction and/or failure in the zones 802a-d of the TE device 802. For instance, if each of the potentials 814a-c are found to be about equal, but the potential 814d is substantially higher or lower than the potentials 814a-c, then there may be a problem with the TE device 802 at zone 802d. Accordingly, in such embodiments, a flag, alarm, or other indicator can be provided regarding the possible problem. For example, in an embodiment in which the TE device 802 is employed in an automotive seat, an error code can be provided to the vehicle's on-board computer regarding a possible problem with the TE device 802.

Although TE systems and control methods therefore have been disclosed in the context of certain embodiments and examples, it will be understood by those skilled in the art that the TE systems and control methods therefore extend beyond the specifically disclosed embodiments to other alternative embodiments and/or uses of the embodiments and certain modifications and equivalents thereof. It should be understood that various features and aspects of the disclosed embodiments can be combined with or substituted for one another in order to form varying modes of the vial adaptor. For example, the temperature of a surface of the TE device can be determined by both a temperature sensor 112 associated with the TE device (see FIG. 1) and by correlating the Seebeck potential of the TE device to an absolute temperature of a side of the TE device. Accordingly, it is intended that the scope of the TE systems and control methods therefore herein-disclosed should not be limited by the particular disclosed embodiments described above, but should be determined only by a fair reading of the claims that follow.

What is claimed is:

1. A thermoelectric system comprising:
   a thermoelectric device comprising a first surface and a second surface;
   a power source configured to deliver a voltage across the thermoelectric device to selectively activate or deactivate the thermoelectric device;
   wherein the first surface is configured to heat and the second surface is configured to cool with the delivery of the voltage across the thermoelectric device; and
   a processor configured to:
   determine a potential between the first surface and the second surface when the thermoelectric device is deactivated;
   correlate the potential to a temperature of the first surface based at least in part on the voltage delivered across the thermoelectric device; and
   adjust the correlated temperature of the first surface based on an ambient temperature.

2. The system of claim 1, wherein the voltage is configured to be delivered to the thermoelectric device at a duty cycle, and wherein the processor is further configured to adjust the correlated temperature of the first surface based on the duty cycle.

3. The system of claim 1, wherein the power source comprises a battery.

4. The system of claim 1, wherein the processor is configured to detect overheating thermoelectric device based on the correlated temperature of the first surface.

5. The system of claim 1, wherein the processor is further configured to:
   compare the temperature of the first surface with a desired temperature; and
   adjust the amount of power supplied to the thermoelectric device by the power source, thereby reducing an amount of error between the temperature of the first surface and the desired temperature.

6. The system of claim 1, further comprising a second thermoelectric device.

7. The system of claim 6, wherein the processor is further configured to:
   determine a potential between a first surface and a second surface of the second thermoelectric device when the second thermoelectric device is deactivated;
   correlate the potential between the first and second surfaces of the second thermoelectric device to a temperature of the first surface of the second thermoelectric device;
   compare the temperature of the first surface of the second thermoelectric device with the temperature of the first surface of the first thermoelectric device; and
   adjust an output to at least one of the first and second thermoelectric devices based on the comparison.

8. The system of claim 6, further comprising a fluid conduit configured to convey fluid from a first end of the fluid conduit to a second end of the fluid conduit, wherein the first and second thermoelectric devices are positioned in the fluid conduit.

9. The system of claim 8, wherein second thermoelectric device is positioned in series with the first thermoelectric device relative to fluid flow through the fluid conduit.

10. The system of claim 8, wherein the second thermoelectric device is positioned in parallel with the first thermoelectric device relative to the fluid flow through the fluid conduit.

11. The system of claim 1, wherein the thermoelectric device comprises a plurality of zones, wherein the processor is further configured to:
    determine a potential between the first surface and the second surface in each of the zones when the thermoelectric device is deactivated; and
    determine whether a malfunction of at least one of the zones has occurred based on the potential of each of the zones.

12. The system of claim 1, wherein the thermoelectric device is located in at least one of an automobile seat, a cup holder, a cool bin, a bed system, a medical application, or a battery thermal management or system.

13. The system of claim 1, wherein the processor is configured to determine the correlated temperature during or after a duty cycle of the thermoelectric device with the thermoelectric system operating, the duty cycle corresponding to a ratio of the thermoelectric device being powered to a total amount of time under consideration.

14. The system of claim 13, wherein the processor is configured to correlate the potential to the temperature of the first surface based at least in part on the duty cycle.

15. A method of controlling a duty cycle or a power level of a thermoelectric device, the method comprising:
    determining a potential between a first surface of a thermoelectric device and a second surface of the thermoelectric device when the thermoelectric device is electrically deactivated or depowered;
    wherein the first surface is configured to heat and the second surface is configured to cool when the thermoelectric device is electrically activated or powered;
    correlating the potential with a temperature of the first surface of the thermoelectric device at least partially based on a voltage delivered across the thermoelectric device when the thermoelectric device is electrically activated or powered; and adjusting the duty cycle or the power level of the thermoelectric device based on a comparison of the temperature of the first surface of the thermoelectric device with a desired temperature.

16. The method of claim 15, further comprising adjusting the temperature of first surface based on the duty cycle or power level of the thermoelectric device.

17. The method of claim 15, wherein correlating the potential with the temperature of first surface is accomplished using a lookup table or calculation.

18. A method of providing temperature control to a system, the method comprising:

powering a thermoelectric device from a power source, the thermoelectric device comprising a first surface and a second surface, said thermoelectric device being configured to be selectively activated or deactivated;

determining a potential between the first surface and the second surface when the thermoelectric device is deactivated;

correlating the potential with a temperature of the first surface based at least in part on a voltage delivered across the thermoelectric device from the power source;

comparing the temperature of the first surface with a desired temperature value; and adjusting the power received by the thermoelectric device based on the comparison, thereby changing an amount of heat exchanged between a fluid and at least one of the first surface and the second surface, wherein the fluid is provided to the system.

19. The method of claim 18, wherein the voltage is configured to be delivered to the thermoelectric device at a duty cycle, and further comprising adjusting the correlated temperature of the first surface based on the duty cycle.

20. The method of claim 18, wherein the power source comprises a battery.

21. The method of claim 18, further comprising detecting overheating of the thermoelectric device based on the correlated temperature of the first surface.

22. The method of claim 18, wherein the thermoelectric device comprises a plurality of zones, the method further comprising:

determining a potential between the first surface and the second surface in each of the zones when the thermoelectric device is deactivated or depowered; and determining whether a malfunction of at least one of the zones has occurred based on the potential of each of the zones.

23. The method of claim 18, wherein the system comprises at least one of a vehicle seat, a cup holder, a cool bin, a medical application, a bed system, a cooling tower, a cooling device, battery thermal management, or a thermoelectric generator.

* * * * *